US008663489B2

(12) United States Patent  (10) Patent No.: US 8,663,489 B2
Ishizawa et al.  (45) Date of Patent: Mar. 4, 2014

(54) SUBSTRATE REPLACING METHOD AND SUBSTRATE PROCESSING APPARATUS

(75) Inventors: Shigeru Ishizawa, Nirasaki (JP); Hiroshi Koizumi, Nirasaki (JP); Tatsuya Ogi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1013 days.

(21) Appl. No.: 12/732,451

(22) Filed: Mar. 26, 2010

(65) Prior Publication Data

US 2010/0252532 A1   Oct. 7, 2010

(30) Foreign Application Priority Data

Apr. 1, 2009  (JP) ................................. 2009-089509

(51) Int. Cl.
 *B44C 1/22*   (2006.01)
(52) U.S. Cl.
 USPC .................... 216/58; 156/345.31; 156/345.32; 414/935; 414/939; 414/940; 414/941
(58) Field of Classification Search
 USPC .................... 216/58; 414/935, 939, 940, 941; 156/345.31, 345.32
 See application file for complete search history.

(56) References Cited

U.S. PATENT DOCUMENTS

| | | | | |
|---|---|---|---|---|
| 6,802,934 | B2 * | 10/2004 | Saeki et al. | 156/345.31 |
| 7,738,987 | B2 * | 6/2010 | Numakura | 700/114 |
| 2008/0044595 | A1 * | 2/2008 | Thakur et al. | 427/570 |
| 2008/0219812 | A1 * | 9/2008 | van der Meulen et al. | 414/217 |
| 2008/0225261 | A1 * | 9/2008 | Hirayanagi | 355/72 |
| 2009/0093906 | A1 * | 4/2009 | Takizawa et al. | 700/214 |
| 2009/0239359 | A1 * | 9/2009 | Ye | 438/479 |

FOREIGN PATENT DOCUMENTS

| JP | 10-189687 | 7/1998 |
|---|---|---|
| JP | 11-067869 | 3/1999 |

OTHER PUBLICATIONS

Korean Office action mailed Jan. 17, 2012 with partial English translation.

* cited by examiner

*Primary Examiner* — Binh X Tran
(74) *Attorney, Agent, or Firm* — IPUSA, PLLC

(57) ABSTRACT

A method for replacing plural substrates to be processed by a substrate processing apparatus which includes a substrate processing chamber, a load lock chamber, and a conveying apparatus including first and second conveying members for conveying the plural substrates into and out from the substrate processing chamber and the load lock chamber. The method includes the steps of a) conveying a first substrate out from the substrate processing chamber with the first conveying member, b) conveying a second substrate into the substrate processing chamber with the second conveying member, c) conveying the second substrate out from the load lock chamber with the second conveying member, and d) conveying the first substrate into the load lock chamber with the first conveying member. The steps c) and d) are performed between step a) and step b).

7 Claims, 17 Drawing Sheets

| | STEP NUMBER | S0 | S1 | S2 | S3 | S4 | S5 | S6 | S7 | S8 |
|---|---|---|---|---|---|---|---|---|---|---|
| CONVEYING APPARATUS | WAFER ON FIRST CONVEYING MEMBER | – | W1 | W1 | – | – | W2 | W2 | – | – |
| | WAFER ON SECOND CONVEYING MEMBER | – | – | W3 | W3 | W3 | – | W4 | W4 | – |
| FIRST SUBSTRATE PROCESSING CHAMBER | INSTALLED WAFER | W1 | – | – | – | W3 | W3 | W3 | W3 | W3 |
| | STATUS | COM-PLETED | CLEANING | | | CONVEY-IN | SUBSTRATE PROCESSING | | | COM-PLETED |
| SECOND SUBSTRATE PROCESSING CHAMBER | INSTALLED WAFER | W2 | W2 | W2 | W2 | W2 | – | – | – | W4 |
| | STATUS | CONVEY-IN | SUBSTRATE PROCESSING | | | COM-PLETED | CLEANING | | | CONVEY-IN |
| FIRST LOAD LOCK CHAMBER | INSTALLED WAFER | W3 | W3 | – | W4 | W1 | W1 | W5 | W5 | W5 |
| | STATUS | VACUUM | | ATMOSPHERIC AIR | EVACU-ATED | ATMOS-PHERIC AIR RELEASED | ATMOSPHERIC AIR | VACUUM | EVACU-ATED | VACUUM |
| SECOND LOAD LOCK CHAMBER | INSTALLED WAFER | ? | ? | W4 | W4 | W4 | W4 | – | W2 | W2 |
| | STATUS | ATMOS-PHERIC AIR RELEASED | ATMOSPHERIC AIR | EVACU-ATED | VACUUM | | | | | ATMOS-PHERIC AIR RELEASED |

CONTINUED FROM FIG.2A →

| | S9 | S10 | S11 | S12 | S13 | S14 | S15 | S16 | S17 | S18 | S19 | S20 | S21 |
|---|---|---|---|---|---|---|---|---|---|---|---|---|---|
| | W3 | W3 | – | – | W4 | W4 | – | – | W5 | W5 | – | – | W6 |
| | – | W5 | W5 | – | – | W6 | W6 | – | – | W7 | W7 | – | W7 |
| | – | – | – | CONVEY-IN | SUBSTRATE PROCESSING | | | COMPLETED | – | CLEANING | | CONVEY-IN | SUBSTRATE PROCESSING |
| | – | – | – | W5 | W5 | W5 | W5 | W5 | W5 | – | – | – | – |
| | SUBSTRATE PROCESSING | CLEANING | | COMPLETED | – | CLEANING | | | SUBSTRATE PROCESSING | | | | |
| | W4 | W4 | W4 | W4 | – | – | – | W6 | W6 | W6 | W6 | W6 | – |
| | W5 | – | W3 | W3 | W3 | W7 | W7 | W7 | W7 | – | – | – | W7 |
| | | VACUUM | | ATMOSPHERIC AIR RELEASED | ATMOSPHERIC AIR | – | EVACU-ATED | | VACUUM | | | | |
| | | – | – | W6 | W6 | – | W4 | W4 | W4 | W8 | W8 | W8 | W8 |
| | W2 | W6 | EVACU-ATED | ATMOSPHERIC AIR RELEASED | ATMOSPHERIC AIR | | | ATMOSPHERIC AIR RELEASED | ATMOSPHERIC AIR | | EVACU-ATED | VACUUM | |
| | ATMOSPHERIC AIR | | | | VACUUM | | | | | | | | |

FIG.4B

| | S9' | S10' | S11' | S12' | S13' | S14' | S15' | S16' | S17' | S18' | S19' | S20' | S21' |
|---|---|---|---|---|---|---|---|---|---|---|---|---|---|
| | W2 | W2 | – | – | W3 | W3 | W3 | W3 | – | – | W4 | W4 | W4 |
| | W4 | – | – | W5 | W5 | W5 | W5 | – | – | W6 | W6 | W6 | W6 |
| | W3 | W3 | W3 | W3 | – | – | – | W5 | W5 | W5 | W5 | W5 | W5 |
| | WAITING TIME | | | COM-PLETED | | CLEANING | | CONVEY-IN | SUBSTRATE PROCESSING | | | WAITING TIME | |
| | W4 | W4 | W4 | W4 | W4 | W4 | W4 | W4 | W4 | COM-PLETED | – | – | – |
| | CLEAN-ING | CONVEY-IN | SUBSTRATE PROCESSING | | | | WAITING TIME | | W3 | W3 | W3 | CLEANING | |
| | W5 | W5 | W5 | | | | | | W6 | ATMOS-PHERIC AIR RELEASED | ATMOSPHERIC AIR | | W7 |
| | EVACU-ATED | – | W2 | W2 | W2 | ATMOSPHERIC AIR | EVACU-ATED | W6 | W6 | | | W7 | EVACU-ATED |
| | – | VACUUM | | | | | | | VACUUM | | | | – |
| | VACUUM | | | | | | | | | | | | |

CONTINUED FROM FIG. 4A

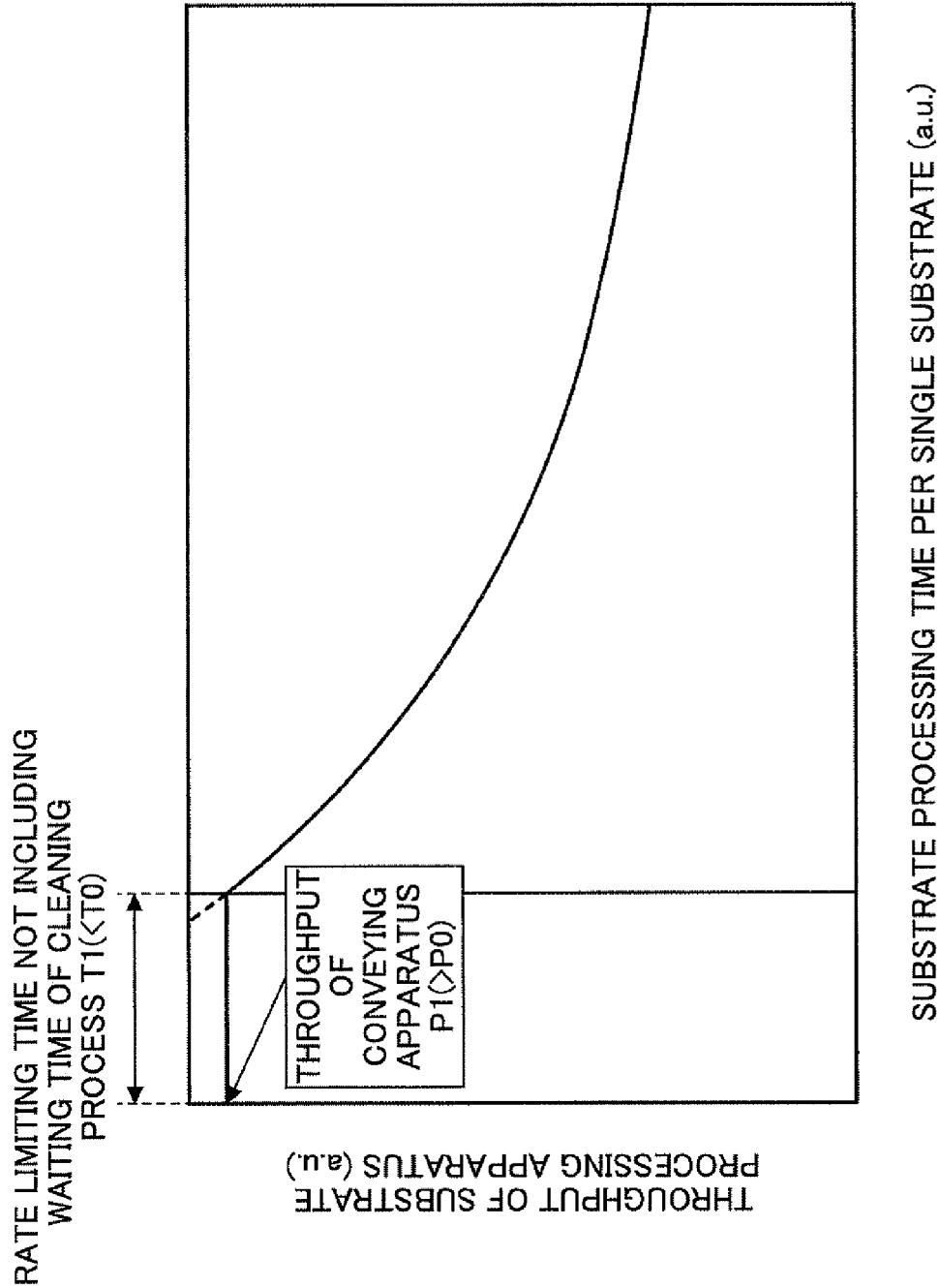

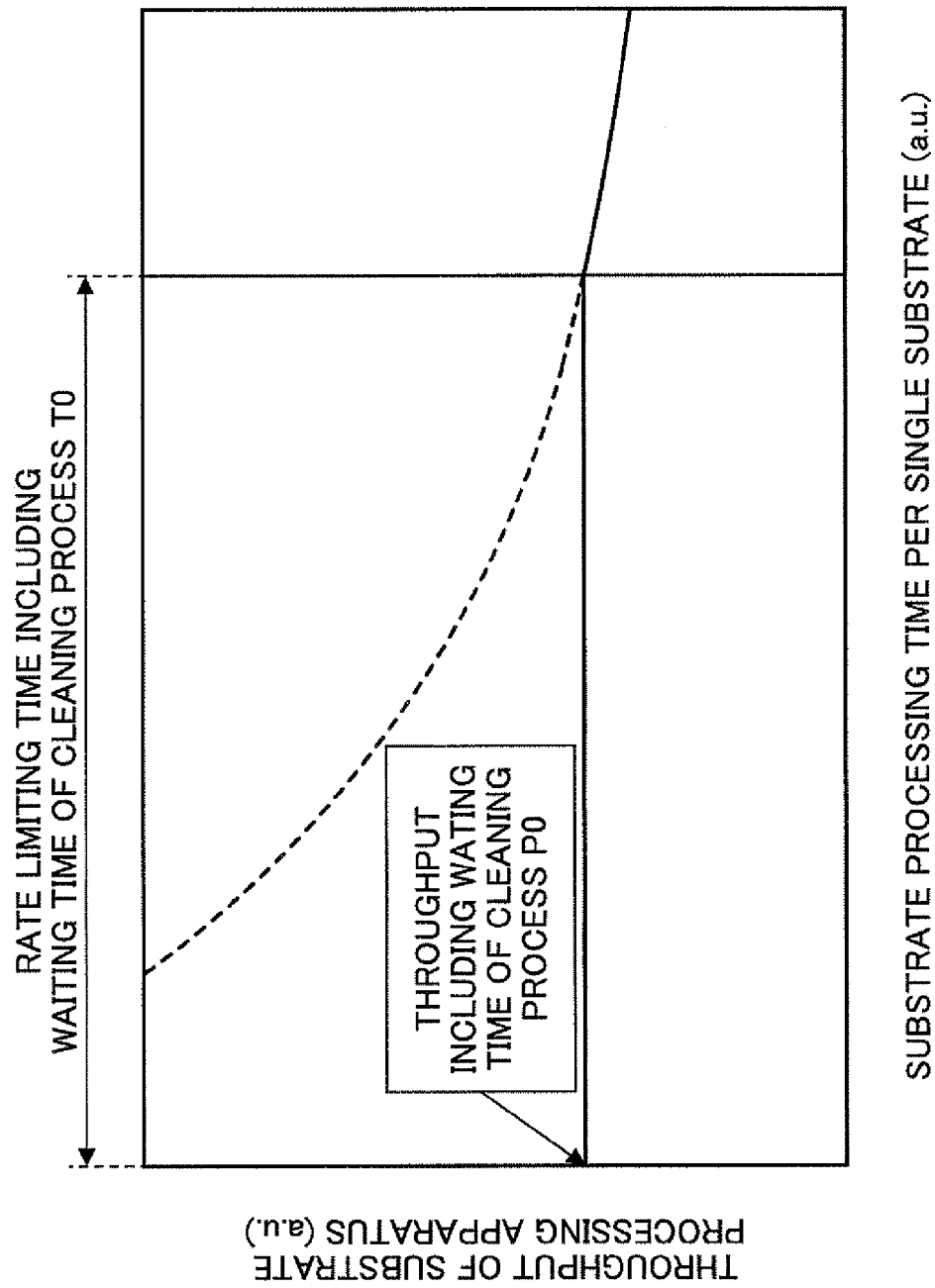

FIG.7A

| | STEP NUMBER | S100 | S101 | S102 | S103 | S104 | S105 | S106 | S107 | S108 | S109 |
|---|---|---|---|---|---|---|---|---|---|---|---|
| CONVEYING APPARATUS | WAFER ON FIRST CONVEYING MEMBER | – | W1 | W1 | W1 | – | W2 | W2 | W2 | – | W3 |
| | WAFER ON SECOND CONVEYING MEMBER | W3 | W3 | – | W4 | W4 | W4 | – | W5 | W5 | W5 |
| FIRST SUBSTRATE PROCESSING CHAMBER | INSTALLED WAFER | W1 | – | – | – | – | – | – | W4 | W4 | W4 |
| | STATUS | COM-PLETED | CLEANING | | | | | CONVEY-IN | SUBSTRATE PROCESSING | | |
| SECOND SUBSTRATE PROCESSING CHAMBER | INSTALLED WAFER | – | – | W3 | W3 | W3 | W3 | W3 | W3 | W3 | – |
| | STATUS | CLEANING | CLEANING | CONVEY-IN | SUBSTRATE PROCESSING | | | | | COM-PLETED | CLEAN-ING |
| THIRD SUBSTRATE PROCESSING CHAMBER | INSTALLED WAFER | W2 | W2 | W2 | W2 | W2 | – | – | – | – | – |
| | STATUS | SUBSTRATE PROCESSING | | | | COM-PLETED | CLEANING | | | | |
| FIRST LOAD LOCK CHAMBER | INSTALLED WAFER | W4 | W4 | W4 | – | W1 | W1 | W1 | W1 | W6 | W6 |
| | STATUS | ATMOS-PHERIC AIR | EVACUATED | EVACUATED | VACUUM | VACUUM | ATMOSPHERIC AIR RELEASED | ATMOSPHERIC AIR | ATMOSPHERIC AIR | ATMOSPHERIC AIR | EVACU-ATED |
| SECOND LOAD LOCK CHAMBER | INSTALLED WAFER | ? | ? | ? | ? | W5 | W5 | W5 | – | W2 | W2 |
| | STATUS | VACUUM | ATMOSPHERIC AIR RELEASED | ATMOSPHERIC AIR | ATMOSPHERIC AIR | EVACUATED | EVACUATED | EVACUATED | VACUUM | VACUUM | ATMOSPHERIC AIR RELEASED |

| Step Number | | S200 | S201 | S202 | S203 | S204 | S205 | S206 | S207 | S208 | S209 |
|---|---|---|---|---|---|---|---|---|---|---|---|
| CONVEYING APPARATUS | WAFER ON FIRST CONVEYING MEMBER | — | W1 | W1 | — | — | — | W2 | — | — | W3 |
| | WAFER ON SECOND CONVEYING MEMBER | — | — | W3 | W3 | — | — | W4 | W4 | W4 | — |
| FIRST SUBSTRATE PROCESSING CHAMBER | INSTALLED WAFER | W1 | | | | | | | | W4 | W4 |
| | STATUS | COMPLETED | CLEANING | | | | | | | CONVEY-IN | SUBSTRATE PROCESSING |
| SECOND SUBSTRATE PROCESSING CHAMBER | INSTALLED WAFER | — | | | | W3 | W3 | W3 | W3 | W3 | — |
| | STATUS | CLEANING | | | | CONVEY-IN | SUBSTRATE PROCESSING | | | COMPLETED | CLEANING |
| THIRD SUBSTRATE PROCESSING CHAMBER | INSTALLED WAFER | W2 | W2 | W2 | W2 | W2 | — | — | — | — | — |
| | STATUS | CONVEY-IN | SUBSTRATE PROCESSING | | | COMPLETED | CLEANING | | | | |
| FIRST LOAD LOCK CHAMBER | INSTALLED WAFER | W3 | W3 | — | W4 | W4 | W4 | W5 | W5 | W5 | W5 |
| | STATUS | EVACUATED | ATMOSPHERIC AIR | VACUUM | ATMOSPHERIC AIR RELEASED | ATMOSPHERIC AIR | EVACUATED | VACUUM | | | |
| SECOND LOAD LOCK CHAMBER | INSTALLED WAFER | ? | ? | W4 | W4 | W4 | W4 | — | W2 | W2 | W2 |
| | STATUS | ATMOSPHERIC AIR RELEASED | ATMOSPHERIC AIR | | | | | VACUUM | | ATMOSPHERIC AIR RELEASED | ATMOSPHERIC AIR |

CONTINUED FROM FIG. 8A → ③

| | S210 | S211 | S212 | S213 | S214 | S215 | S216 | S217 | S218 | S219 | S220 | S221 | S222 | S223 |
|---|---|---|---|---|---|---|---|---|---|---|---|---|---|---|
| | W3 | – | – | W4 | W4 | – | – | W5 | W5 | – | – | W6 | W6 | – |
| | W5 | W5 | – | – | W6 | W6 | – | – | W7 | W7 | W7 | – | W8 | W8 |
| | W4 | W4 | W4 | – | – | – | W5 | – | – | – | W6 | W7 | W7 | W7 |
| | SUBSTRATE PROCESSING | | COMPLETED | | | | | | | | CONVEY-IN | SUBSTRATE PROCESSING | | |
| | – | – | – | | | CLEANING | | SUBSTRATE PROCESSING | | | COMPLETED | | CLEANING | |
| | – | – | – | – | – | – | – | – | – | – | – | – | – | – |
| | | CLEANING | | W5 | W5 | W5 | W5 | – | – | – | W5 | W5 | – | – |
| | W3 | W3 | CONVEY-IN | W3 | SUBSTRATE PROCESSING | | W7 | W7 | – | W8 | ATMOSPHERIC AIR RELEASED | ATMOSPHERIC AIR | W9 | W9 |
| | W6 | VACUUM | ATMOSPHERIC AIR RELEASED | ATMOSPHERIC AIR | | EVACUATED | W4 | W4 | VACUUM | W8 | W8 | ATMOSPHERIC AIR | – | EVACUATED |
| | VACUUM | EVACUATED | W6 | W6 | VACUUM | | ATMOSPHERIC AIR RELEASED | ATMOSPHERIC AIR | | EVACUATED | VACUUM | W8 | – | W6 |
| | ATMOSPHERIC AIR | W6 | EVACUATED | | | | | | | | | EVACUATED | VACUUM | |

← 820

SUBSTRATE REPLACING METHOD AND SUBSTRATE PROCESSING APPARATUS

BACKGROUND OF THE INVENTION

1. Field of the Invention

The present invention generally relates to a substrate replacing method and a substrate processing apparatus.

2. Description of the Related Art

In an operation of manufacturing a semiconductor device, various processes (e.g., deposition, etching) are performed on a semiconductor wafer (target substrate, also simply referred to as "wafer" or "substrate") in a vacuum atmosphere (vacuum process). Recently, a cluster-tool type multi-chamber substrate processing apparatus has begun to draw attention from the standpoint of efficiency of the vacuum process and the standpoint of preventing contamination and oxidation. The cluster-tool type multi-chamber substrate processing apparatus (hereinafter also simply referred to as multi-chamber type substrate processing apparatus or substrate processing apparatus) includes plural substrate processing chambers and a conveying chamber including a conveying apparatus. The plural substrate processing chambers are for performing a vacuum process(es) on a wafer(s). The conveying chamber, being maintained in a vacuum state, is connected to the plural substrate processing chambers. The conveying apparatus conveys the wafer into or out from the plural substrate processing chambers.

In order to convey a wafer from a wafer cassette provided at atmospheric pressure to a conveying chamber maintaining a vacuum pressure state, the multi-chamber type substrate processing apparatus has a load lock chamber provided between the wafer cassette and the conveying chamber, so that the wafer can be conveyed via the load lock chamber.

Typically, wafers are conveyed in and out between the substrate processing chamber and the load lock chamber by a conveying apparatus provided in a conveying chamber. The conveying apparatus is able to swivel inside a limited space and has two extendable conveying arms for conveying wafers to far positions. The conveying apparatus has plural combinations of conveying arms and a rotating shaft provided for a pedestal of the conveying apparatus. A conveying member (pick) is provided on each distal end of the conveying arms for mounting a wafer thereon.

In a case of conveying plural wafers by using the conveying apparatus including the conveying members and the conveying arms and performing a process on the wafers one by one, it may be necessary to determine a schedule that defines in which chamber a wafer is to be processed. For example, Japanese Laid-Open Patent Application No. 10-189687 discloses a substrate processing apparatus which assigns priority to each chamber and conveys a wafer to a chamber having highest priority.

In another example, Japanese Laid-Open Patent Application No. 11-67869 discloses a substrate processing apparatus which determines whether plural substrate processing chambers are operational and conveys a wafer only to a chamber determined to be operational.

However, the substrate processing apparatus disclosed in Japanese Laid-Open Patent Application Nos. 10-189687 and 11-67869 has the following difficulty in a case of replacing wafers in a substrate processing chamber.

The substrate processing apparatuses of Japanese Laid-Open Patent Application Nos. 10-189687 and 11-67869 can select a substrate processing chamber to which a wafer is to be conveyed beforehand. However, recently, in order to maintain the substrate processing chamber in a desired state, a cleaning process (e.g., plasma cleaning) is performed in the substrate processing chamber between a step of conveying a wafer out from the substrate processing chamber after performing a substrate processing process on the wafer and a step of conveying a subsequent unprocessed wafer into the substrate processing chamber. The subsequent unprocessed wafer cannot be conveyed into the substrate processing chamber during the cleaning process. Therefore, there is a difficulty that the conveying apparatus is required to wait in a state having the subsequent unprocessed wafer mounted on the conveying member (pick).

Particularly, because each layer of a semiconductor device is becoming thinner as design rules of semiconductor devices require finer size semiconductor devices, the times for performing a substrate processing process (e.g., deposition, etching) on wafers in the substrate processing chamber is becoming shorter. As a result, the proportion of the time for performing the cleaning process to the time for performing the substrate processing process is increasing. Therefore, in the case where the conveying apparatus is required to wait in a state having the subsequent unprocessed wafer mounted on the conveying member, the conveying apparatus is unable to perform any operations during the cleaning process. Accordingly, it is difficult to attain a satisfactory throughput of the conveying apparatus (i.e. the number of wafers that can be conveyed by the conveying apparatus per unit of time).

SUMMARY OF THE INVENTION

The present invention may provide a substrate replacing method and a substrate processing apparatus that substantially eliminate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a substrate replacing method and a substrate processing apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a method for replacing a plurality of substrates to be processed by a substrate processing apparatus including a substrate processing chamber, a load lock chamber, and a conveying apparatus including first and second conveying members for conveying the plural substrates into and out from the substrate processing chamber and the load lock chamber, the method including the steps of: a) conveying a first substrate out from the substrate processing chamber with the first conveying member; b) conveying a second substrate into the substrate processing chamber with the second conveying member; c) conveying the second substrate out from the load lock chamber with the second conveying member; and d) conveying the first substrate into the load lock chamber with the first conveying member; wherein the steps c) and d) are performed between step a) and step b).

Other objects and further features of the present invention will be apparent from the following detailed description when read in conjunction with the accompanying drawings.

BRIEF DESCRIPTION OF THE DRAWINGS

FIGS. 2A and 2B illustrate a time chart for describing a substrate replacing method according to a first embodiment of the present invention;

FIGS. 4A and 4B illustrate a time chart for describing a substrate replacing method according to a related art example;

FIG. 6A illustrates a graph corresponding to a substrate replacing method according to an embodiment of the present invention;

FIG. 6B illustrates a graph corresponding to a substrate replacing method according to a related art example;

FIGS. 7A and 7B illustrate a time chart for describing a substrate replacing method according to a second embodiment of the present invention; and FIGS. 8A and 8B illustrate a time chart for describing a substrate replacing method according to a third embodiment of the present invention.

DESCRIPTION OF THE PREFERRED EMBODIMENTS

In the following, embodiments of the present invention will be described with reference to the accompanying drawings.

First Embodiment

A first embodiment of a substrate processing apparatus 100 having a substrate replacing mechanism is described with reference to FIG. 1.

Figure 1:
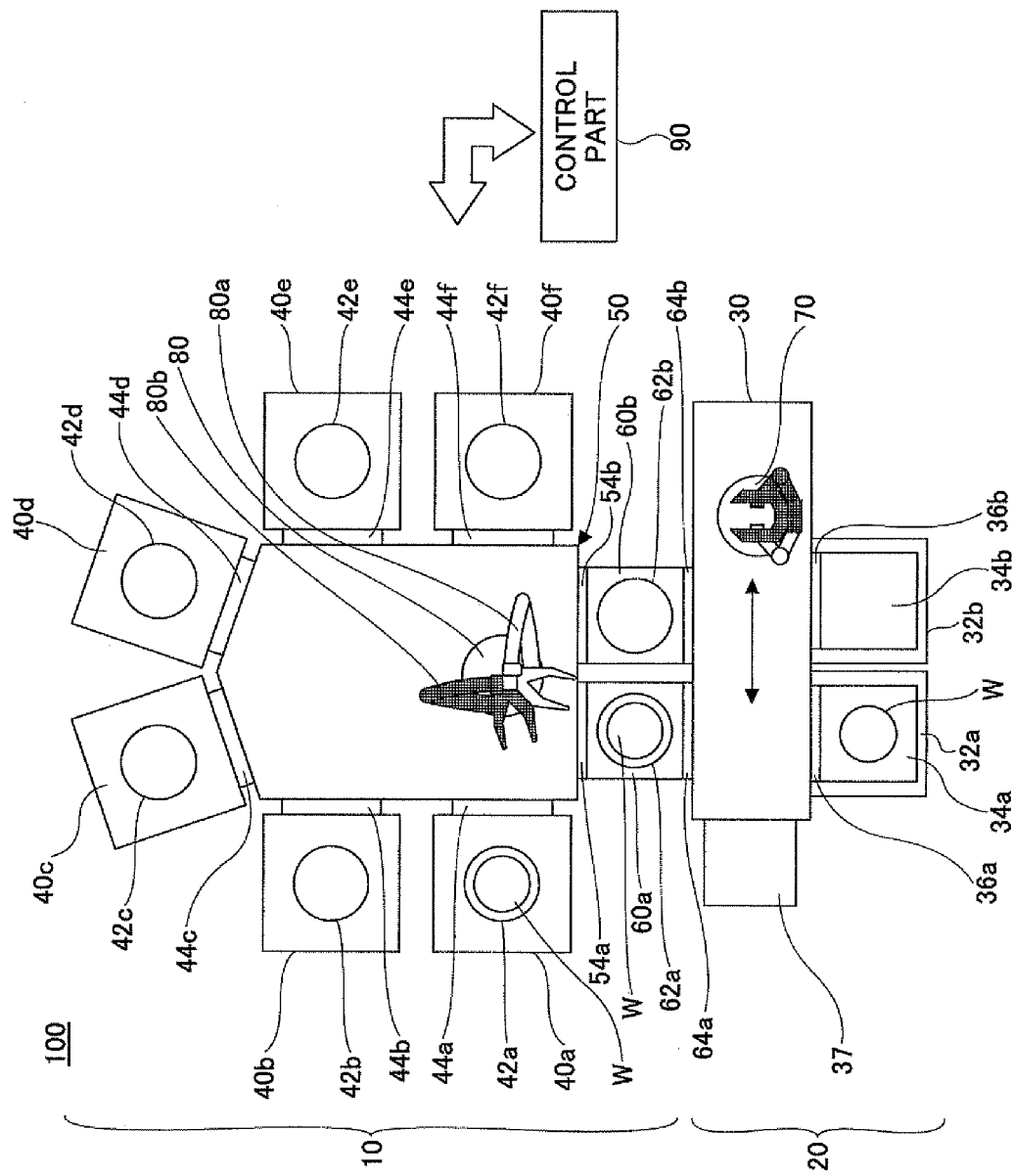
FIG. 1 is a plan view illustrating a configuration of a substrate processing apparatus according to an embodiment of the present invention.

FIG. 1 is a plan view illustrating a configuration of the substrate processing apparatus 100 according to the first embodiment of the present invention.

The substrate processing apparatus 100 includes a processing unit 10 for performing various processes (e.g., deposition, etching) on a wafer W (target substrate subject to processing by the substrate processing apparatus 100) and a conveying unit 20 for conveying the wafer W to and from the processing unit 10. The conveying unit 20 includes a conveying chamber 30 that is shared when conveying the wafer W. The conveying unit 20 is also referred to as "conveying unit side conveying chamber" to be distinguished from the below-described processing unit side conveying chamber.

The conveying chamber 30 according to an embodiment of the present invention has a box shape with a polygonal cross section. The conveying chamber 30 is configured to circulate inert gas (e.g., $N_2$ gas) or clean air therein.

Plural cassette pedestals 32 (in this embodiment, cassette pedestals 32a and 32b) are arranged on one of the long sides of the polygonal cross section of the conveying chamber 30. The cassette pedestals 32a, 32b are configured to have corresponding cassette containers 34a, 34b mounted thereon.

Each of the cassette containers 34a, 34b is configured to stack, for example, a maximum of 25 wafers W on multiple levels (stages) arranged at an equal pitch. The inside of each of the cassette containers 34a, 34b is a hermetically sealing structure filled with, for example, $N_2$ gas. The conveying chamber 30 can convey the wafers W in and out through gate valves 36a, 36b.

In this example, wafers W to be processed at the below-described substrate processing chambers 40a through 40f are installed in corresponding cassette containers 34a, 34b. However, in a case where the substrate processing chamber for processing the wafer is known beforehand, the wafers W do not have to be distinctly installed in each of the cassette containers 34a, 34b. The wafers W to be processed by the substrate processing chambers 40a-40f may be installed in either one or both of the cassette containers 34a, 34b in a mixed order. Although FIG. 1 illustrates an embodiment where the two cassette containers 34a, 34b include corresponding cassette pedestals 32a, 32b, the numbers of the cassette pedestals or the cassette containers are not limited to those of this embodiment. For example, the number of the cassette pedestals or the cassette containers may be 3 or more.

An orienter (position defining apparatus) 37 is provided on one end of the conveying chamber (i.e. one of the short sides of the polygonal cross section of the conveying chamber 30). The orienter 37 is for detecting the state of the wafer W (e.g., wafer flat (orientation flat), notch) and adjusting the position of the wafer.

The processing unit 10 includes a substrate processing chamber 40 for performing various processes such as deposition (e.g., plasma CVD (Chemical Vapor Deposition)) or etching (e.g., plasma etching) on the wafer W. In the embodiment of FIG. 1, six processing chambers 40 (40a-40f) are provided in the processing unit 10. Wafer pedestals 42a-42f for mounting wafers W thereon are provided inside corresponding processing chambers 40a-40f. The number of the processing chambers 40 is not limited to six. For example, the number of the processing chambers 40 may be less than six or greater than six.

The processes performed in the substrate processing chambers 40a-40f may be the same kind of process or could be different kinds of processes. Various processes are performed on the wafers W in each of the substrate processing chambers 40a-40f based on, for example, data of processes (e.g., etching) stored in a memory of a control part 90 (process recipe). The substrate processing chamber 40a-40f in which each wafer W is to be processed may be determined based on the process recipe.

The processing unit 10 includes a conveying chamber (processing unit side conveying chamber) 50 for conveying the wafer W to and from the substrate processing chambers 40a-40f. The conveying chamber 50 has a polygonal shape (e.g., pentagon, hexagon). Gate valves 44a-44f are provided to the sides of the conveying chamber 50.

One example of a vacuum preparation chamber(s) connected to the conveying unit 20 and provided at the periphery of the conveying chamber 50 is first and second load lock chambers 60a, 60b. More specifically, for example, the first and second load lock chambers 60a, 60b are connected to the periphery of the conveying chamber 50 via distal ends of the first and second load lock chambers 60a, 60b. The proximal ends of the first and second load lock chambers 60a, 60b are connected to the other one of the long sides of the polygonal cross section of the conveying chamber 30 via gate valves (vacuum side gate valves) 64a, 64b.

The first and second load lock chambers 60a, 60b are configured to be evacuated. The first and second lock chambers 60a, 60b are configured to, for example, temporarily hold the wafer W, perform adjustment of pressure and then deliver the wafer W to another location for further processing. The first and second load lock chambers 60a, 60b include wafer pedestals 62a, 62b for mounting the wafer W thereon. The first and second load lock chambers 60a, 60b may also include a cooling mechanism, a heating mechanism, or both.

The space between the conveying chamber 50 and each of the substrate processing chambers 40a-40f and the space between the conveying chamber 50 and each of the load lock chambers 60a, 60b can be hermetically sealed and opened. The conveying chamber 50 is configured as a cluster tool, so that the conveying chamber 50 can be in communication with the substrate processing chambers 40a-40f and with the load lock chambers 60a, 60b according to necessity.

The conveying chamber 50 includes a conveying apparatus (processing unit side conveying apparatus) 80 having multi-jointed arms (first and second conveying members) 80a, 80b capable of being, for example, extended/contracted, elevated/lowered, and rotated. The conveying apparatus 80 is configured to have access to each of the load lock chambers 60a, 60b and each of the substrate processing chambers 40a-40f. For example, in a case where the wafer W is conveyed to the conveying chamber 50, the conveying apparatus 80 conveys the wafer W to one of the substrate processing chambers 40a-40f at which the wafer W is to be processed.

The conveying mechanism 80 has a double-arm mechanism including two picks. With the picks, two wafers can be handled at a time. Therefore, for example, in a case of conveying wafers to and from one of the substrate processing chambers 40a-40f, a processed wafer can be replaced with an unprocessed wafer or an unprocessed wafer can be replaced with a processed wafer.

The conveying chamber 30 of the conveying unit 20 includes a conveying apparatus (conveying unit side conveying apparatus) 70 that conveys the wafer W along a longitudinal direction of the conveying chamber 30. Similar to the conveying apparatus 80, the conveying apparatus 70 also has a double-arm mechanism including two picks for handing two wafers at a time. Thereby, the conveying apparatus 70 can replace wafers W by conveying wafers W to and from, for example, the cassette container 34 (34a, 34b), the orienter 37, and the load lock chambers 60a, 60b. It is, however, to be noted that the number of picks of the conveying apparatus 70 or 80 is not limited to two. For example, the conveying apparatus 70 or 80 may have a single arm mechanism including a single pick.

The substrate processing apparatus 100 also includes the control part 90 for controlling overall operations of the substrate processing apparatus 100. For example, the control part controls operations of the conveying apparatuses 70, 80, the gate valves 36 (36a, 36b), 44 (44a-44f), 54 (54a, 54b), and 64 (64a, 64b), and the orienter 37. Further, the control part 90 controls, for example, the process of obtaining the timing of conveying the wafer W to the cassette container 34 and the process of conveying the wafer W from the cassette container 34 based on the obtained timing. The control part 90 may include a microcomputer and a memory for storing various data. In this embodiment, the control part 90 is configured to control the conveying (conveying in and conveying out) of the wafer W by the conveying apparatus 80.

Next, a method of replacing a substrate of a substrate processing apparatus (substrate replacing method) according to the first embodiment of the present invention is described with reference to FIGS. 2A through 3E.

According to the below-described substrate replacing method according to the first embodiment of the present invention, two separate steps (a second convey-out step and a second convey-in step) are performed between a first convey-out step and a first convey-in step.

Further, a substrate processing apparatus capable of performing the substrate replacing method according to the first embodiment of the present invention includes: a substrate processing chamber; a load lock chamber; a conveying apparatus that conveys wafers in and out of the substrate processing chamber and the load lock chamber; and a control part that controls the conveying of the wafers by the conveying apparatus. That is, the substrate processing apparatus 100 illustrated in FIG. 1 includes at least one substrate processing chamber and one load lock chamber. However, the below-described embodiment of the substrate replacing method is described in a case where the substrate processing apparatus 100 includes two substrate processing chambers and two load lock chambers.

FIGS. 2A and 2B comprise a time chart for describing the substrate replacing method according to an embodiment of the present invention in which the time chart indicates i) whether a wafer is mounted on the first or second conveying member, ii) whether a wafer is installed in the first or second substrate processing chamber, iii) whether a wafer is installed in the first or second load lock chamber, iv) the status of the inside of the first and second substrate processing chambers, and v) the status of the inside of the first and second load lock chambers. It is to be noted that FIG. 2A continues to FIG. 2B.

FIGS. 3A-3E are for describing the substrate replacing method according to an embodiment of the present invention. FIGS. 3A-3E schematically illustrate i) whether a wafer is mounted on the first and second conveying members, ii) whether a wafer is installed in the first or second substrate processing chamber, iii) whether a wafer is installed in the first or second load lock chamber, iv) the movement of the first and second conveying members, and v) the movement of the wafer.

Figure 3A:
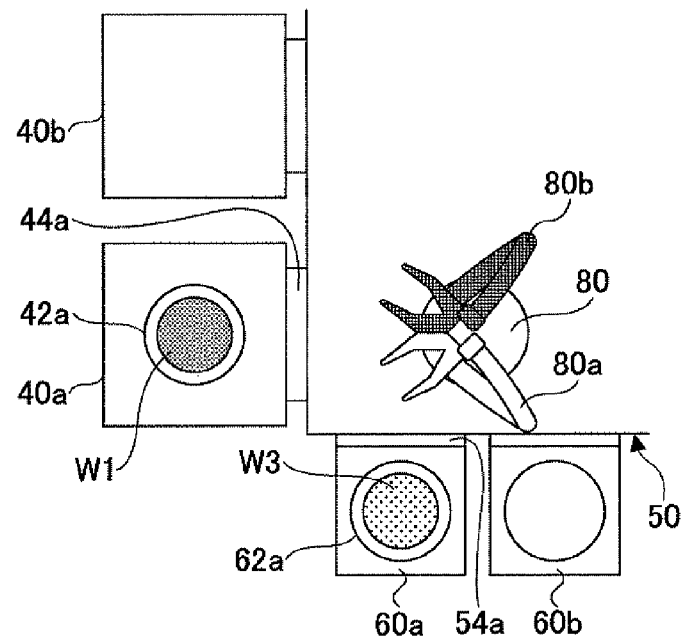
FIGS. 3A-3E are schematic diagrams for describing a substrate replacing method according to the first embodiment of the present invention.

The top left column of the table of FIG. 2A show items which indicate: the step number, the wafer number corresponding to the wafer mounted on the first conveying member 80a of the conveying apparatus 80, the wafer number corresponding to the wafer mounted on the second conveying member 80b of the conveying apparatus 80, the wafer number corresponding to the wafer installed in the first substrate processing chamber 40a, the status of the inside of the first substrate processing chamber 40a, the wafer number corresponding to the wafer installed in the second substrate processing chamber 40b, the status of the inside of the second substrate processing chamber 40b, the wafer number corresponding to the wafer installed in the first load lock chamber 60a, the status of the inside of the first load lock chamber 60a, the wafer number corresponding to the wafer installed in the second load lock chamber 60b, and the status of the inside of the second load lock chamber 60b. FIG. 3A illustrates the first and second conveying members 80a, 80b of the conveying apparatus 80, the first and second substrate processing chambers 40a, 40b, and the first and second load lock chambers 60a, 60b in a status prior to performing the below-described Step S1 of the substrate replacing method according to an embodiment of the present invention (a state immediately before the completion of Step S0). FIG. 3B through FIG. 3E illustrate the statuses of the first and second conveying members 80a, 80b of the conveying apparatus 80, the first and second substrate processing chambers 40a, 40b, and the first and second load lock chambers 60a, 60b after Steps S1-S4 are completed.

The smallest unit of a substrate replacing operation performed by the substrate processing apparatus according to the first embodiment of the present invention is indicated with reference numeral 210 and includes Steps S1 through S4 illustrated in FIG. 2A. Step S1 corresponds to a first convey-out step. Step S2 corresponds to a second convey-out step. Step S3 corresponds to a second convey-in step. Step S4 corresponds to a first convey-in step. That is, in the substrate replacing method according to an embodiment of the present invention, the second convey-out step (Step S2) and the second convey-in step (Step S3) are performed after the first convey-out step (Step S1) is performed but before the first convey-in step (Step S4) is performed.

Step S1 is a step of conveying a wafer W1 out from the first substrate processing chamber 40a by using the first conveying member 80a. Step S2 is a step of conveying a wafer W3 out from the first load lock chamber 60a by using the second conveying member 80b. Step S3 is a step of conveying the wafer W1 into first load lock chamber 60a by using the first conveying member 80a. Step S4 is a step of conveying the wafer W3 into the first substrate processing chamber 40a by using the second conveying member 80b. According to an embodiment of the present invention, the wafer W1 corresponds to a first substrate, and the wafer W3 corresponds to a second substrate.

The status prior to Step S1 is a state after the completion of Step S0 of FIG. 2A, that is, after substrate processing is performed on the first substrate (wafer W1) in the first substrate processing chamber 40a. As illustrated in the column of Step S0 of FIG. 2A and FIG. 3A, no wafer is mounted on either the first conveying member 80a or the second conveying member 80b. The wafer W1 being in a processed state, is mounted on the wafer pedestal 42a of the first substrate processing chamber 40a, and the wafer W3, being in an unprocessed state, is mounted on the wafer pedestal 62a of the first load lock chamber 60a.

First, Step S1 is performed in the substrate replacing method according to an embodiment of the present invention. In Step S1, the wafer W1 is conveyed out from the first substrate processing chamber 40a by the first conveying member 80a. In a state where a substrate processing process has been completed in the first substrate processing chamber 40a, the gate valve 44a of the first substrate processing chamber 40a is opened, then the first conveying member 80a is guided into the first substrate processing chamber 40a, then the wafer W1 on the wafer pedestal 42a of the first substrate processing chamber 40a is mounted on the first conveying member 80a, then the first conveying member 80a is withdrawn from the first substrate processing chamber 40a in a state having the wafer W1 mounted thereon, and then the gate valve 44a of the first substrate processing chamber 40a is closed.

Figure 3B:
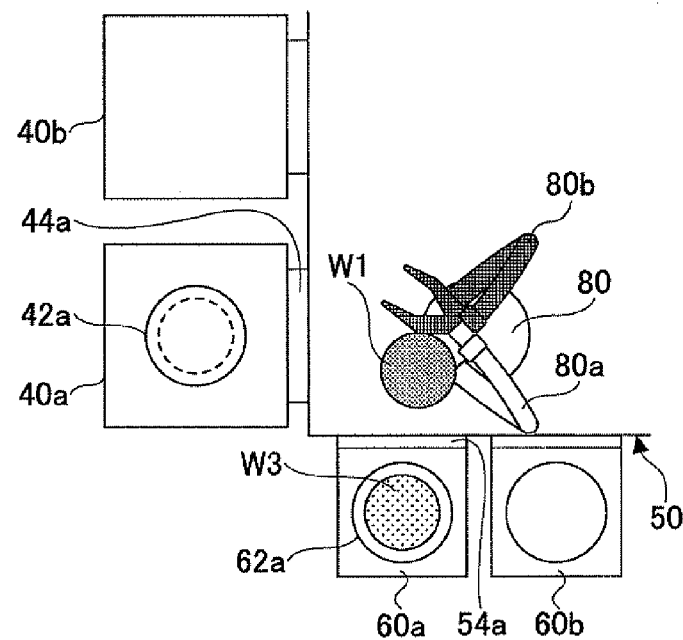
Figure 3C:
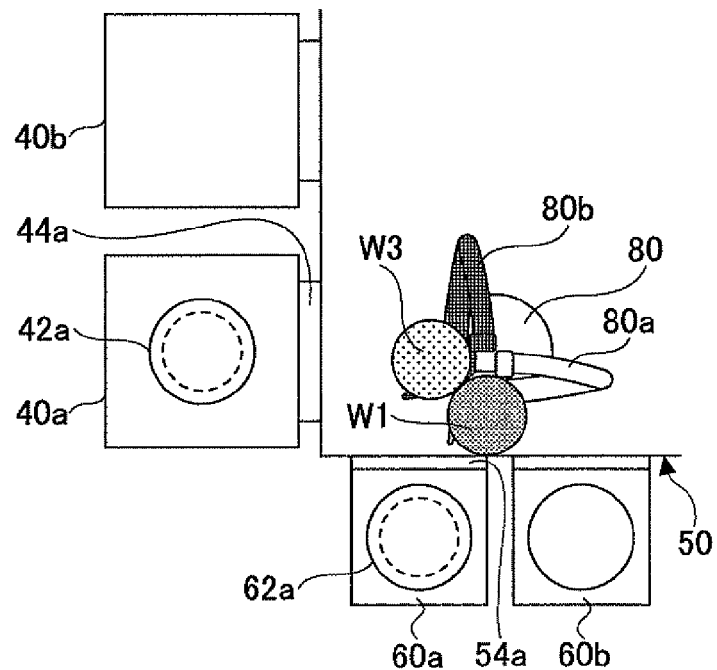
Figure 3D:
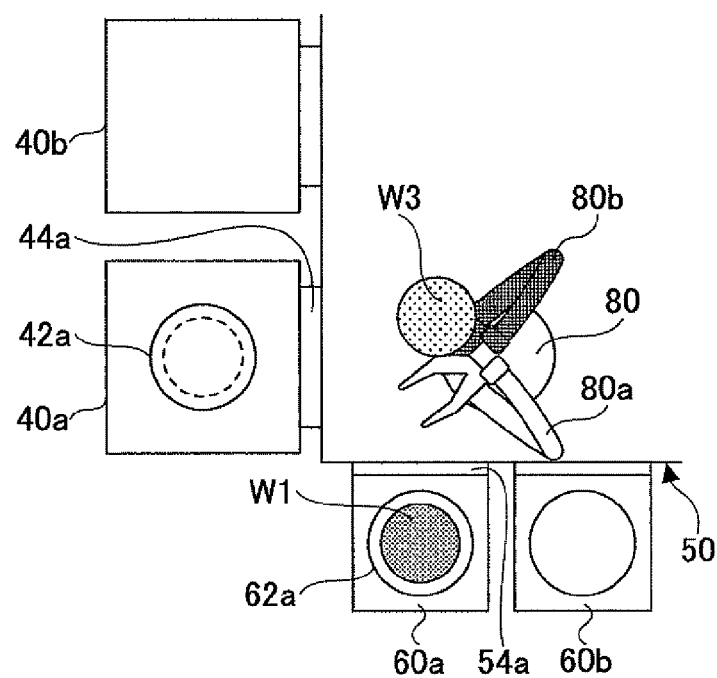
Figure 3E:
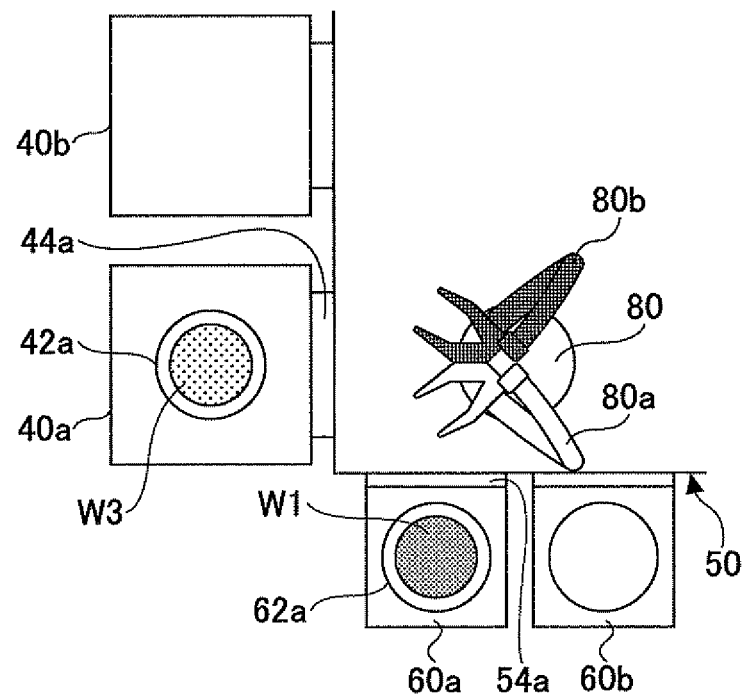

As illustrated in the column of Step S1 of FIG. 2A and FIG. 3B, the wafer W1 is mounted on the first conveying member 80a; no wafer is mounted on the second conveying member 80b; no wafer is installed in the first substrate processing chamber 40a; and the wafer W3 is installed in the first load lock chamber 60a.

After the gate valve 44a of the first substrate processing chamber 40a is closed, a cleaning process is performed inside the first substrate processing chamber 40a in a state where no wafer is mounted on the wafer pedestal 42a. For example, a plasma generating part (not illustrated) provided inside the first substrate processing chamber 40a may be used to perform the cleaning process. The plasma generating part performs the cleaning process by generating plasma inside the first substrate processing chamber 40a and removing particles adhered to the inner wall of the first substrate processing chamber 40 during a substrate processing process (e.g., deposition).

Then, Step S2 is performed. In Step S2, the wafer W3 is conveyed out from the first load lock chamber 60a by the second conveying member 80b. In the first load lock chamber 60a being a vacuum state, the gate valve 54a located towards the conveying chamber 50 is opened, then the second conveying member 80b is guided into the first load lock chamber 60a, then the wafer W3 on the wafer pedestal 62a of the first load lock chamber 60a is mounted on the second conveying member 80b, then the second conveying member 80b is withdrawn from the first load lock chamber 60a in a state having the wafer W3 mounted thereon, and then the gate valve 54a located towards the conveying chamber 50 is closed. After the Step S2 is performed, the wafer W1 is mounted on the first conveying member 80a, the wafer W3 is mounted on the second conveying member 80b, no wafer is installed in the first substrate processing chamber 40a, and no wafer is installed in the first load lock chamber 60a, as illustrated in the column of Step S2 of FIG. 2A and FIG. 3C.

The cleaning process in the first substrate processing chamber 40a is continued during the Step S2.

Then, Step S3 is performed. In Step S3, the wafer W1 is conveyed into the first load lock chamber 60a by the first conveying member 80a. In the first load lock chamber 60a being a vacuum state, the gate valve 54a located towards the conveying chamber 50 is opened, then the first conveying member 80a is guided into the first load lock chamber 60a in a state having the wafer W1 mounted thereon, then the wafer W1 on the first conveying member 80a is mounted on the wafer pedestal 62a of the first load lock chamber 60a, then the first conveying member 80a is withdrawn from the first load lock chamber 60a in a state having no wafer mounted thereon, and then the gate valve 54a located towards the conveying chamber 50 is closed. After Step S3 is performed, no wafer is mounted on the first conveying member 80a, the wafer W3 is mounted on the second conveying member 80b, no wafer is installed in the first substrate processing chamber 40a, and wafer W1 is installed in the first load lock chamber 60a, as illustrated in the column of Step S3 of FIG. 2A and FIG. 3D.

Substantially at the same time as the completion of Step S3 or after the completion of the Step S3, the cleaning process in the first substrate processing chamber 40a is completed before the start of Step S4.

Then, Step S4 is performed. In Step S4, the wafer W3 is conveyed into the first substrate processing chamber 40a by the second conveying member 80b. In the first substrate processing chamber 40a in a state where the cleaning process is completed, the gate valve 44a of the first substrate processing chamber 40a is opened, then the second conveying member 80b is guided into the first substrate processing chamber 40a in a state having the wafer W3 mounted thereon, then the wafer W3 on the second conveying member 80b is mounted on the wafer pedestal 42a of the first substrate processing chamber 40a, then the second conveying member 80b is withdrawn from the first substrate processing chamber 40a in a state having no wafer mounted thereon, and then the gate valve 44a of the first substrate processing chamber 40a is closed. After Step S4 is performed, no wafer is mounted on first and second conveying members 80a, 80b, the wafer W3 is mounted on the first substrate processing chamber 40a, and the wafer W1 is installed in the first load lock chamber 60a.

Accordingly, by performing Steps S1 through S4, an operation of replacing the wafer W1 with the wafer W3 at the first substrate processing chamber 40a can be performed. As illustrated in FIG. 2A, a cleaning process in the first substrate processing chamber 40a can be performed when performing Step 1 through Step S3. In addition, an unprocessed wafer W3 can be replaced with the processed wafer W1 at the first load lock chamber 60a during Steps S1 through S3.

Then, by performing Steps S5 through S8, an operation of replacing a wafer W2 with the wafer W4 at the second substrate processing chamber 40b can be performed. As illustrated in FIG. 2A, a cleaning process in the second substrate processing chamber 40b can be performed between the process of Step 5 (conveying a processed wafer W2 out from the second substrate processing chamber 40b) and the process of Step S7 (step of conveying the processed wafer W2 into the second load lock chamber 60b). In addition, an unprocessed wafer W4 can be replaced with the processed wafer W2 at the second load lock chamber 60b.

Further, the wafer W3 can be processed in the first substrate processing chamber 40a between Step S5 and S8.

In a case of using both the first and second substrate processing chambers 40a, 40b and both the first and second load lock chambers 60a, 60b, the processes in Steps 1 through S8 can be repeated from Step S9 and after. That is, in the substrate processing apparatus 100 having two substrate processing chambers 40a, 40b and two load lock chambers 60a, 60b, the smallest unit of an operation including a substrate processing process according to an embodiment of the present invention is indicated with reference numeral 220 and includes Steps S1 through S8 (8 steps) illustrated in FIG. 2A.

Next, the advantage(s) of improving the throughput of the conveying apparatus 80 by not putting the conveying apparatus 80 in a waiting state is described with reference to FIGS. 4A through 6B.

First, a substrate replacing method of the substrate processing apparatus according to an embodiment of the present invention is described in comparison with a substrate replacing method of a related art example and with reference to FIGS. 4A to 5E.

Figure 4A:
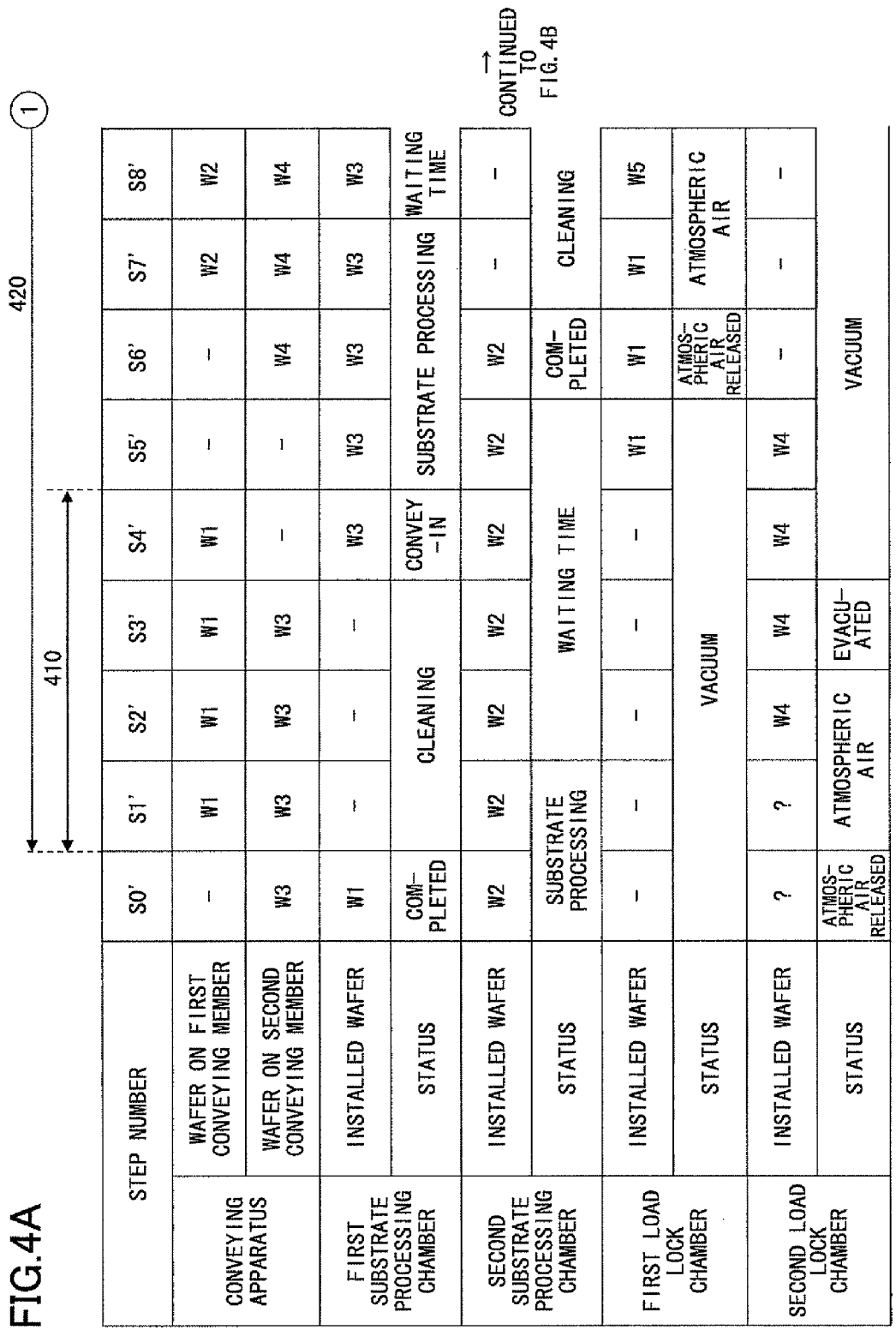

FIGS. 4A and 4B comprise a time chart for describing a substrate replacing method according to a related art example in which the time chart indicates i) whether a wafer is mounted on the first or second conveying member, ii) whether a wafer is installed in the first or second substrate processing chamber, iii) whether a wafer is installed in the first or second load lock chamber, iv) the status of the inside of the first and second substrate processing chambers, and v) the status of the inside of the first and second load lock chambers. It is to be noted that FIG. 4A continues to FIG. 4B. FIGS. 5A-5E are for describing the substrate replacing method according to an embodiment of the present invention. FIGS. 5A-5E schematically illustrate i) whether a wafer is mounted on the first and second conveying members, ii) whether a wafer is installed in the first or second substrate processing chamber, iii) whether a wafer is installed in the first or second load lock chamber, iv) the movement of the first and second conveying members, and v) the movement of the wafer.

Figure 5A:
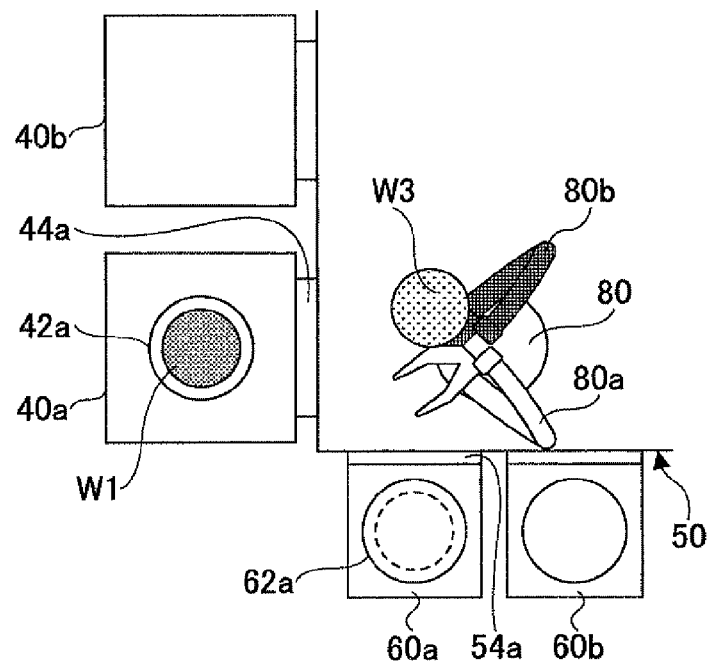
FIGS. 5A-5E are schematic diagrams for describing a substrate replacing method according to the related art example.
Figure 5B:
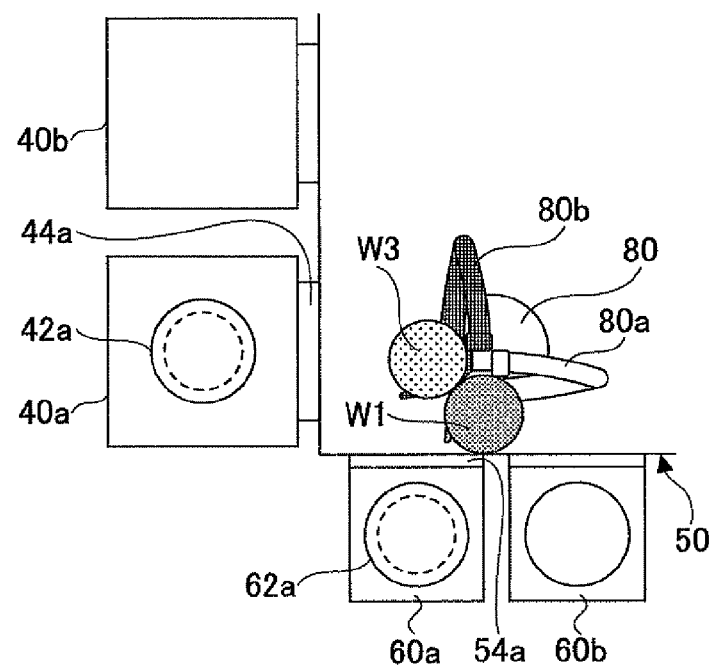

In the same manner as the time chart of FIGS. 2A and 2B, the top left column of the table of FIG. 4A shows items which indicate: the step number, the wafer number corresponding to the wafer mounted on the first conveying member 80a of the conveying apparatus 80, the wafer number corresponding to the wafer mounted on the second conveying member 80b of the conveying apparatus 80, the wafer number corresponding to the wafer installed in the first substrate processing chamber 40a, the status of the inside of the first substrate processing chamber 40a, the wafer number corresponding to the wafer installed in the second substrate processing chamber 40b, the status of the inside of the second substrate processing chamber 40b, the wafer number corresponding to the wafer installed in the first load lock chamber 60a, the status of the inside of the first load lock chamber 60a, the wafer number corresponding to the wafer installed in the second load lock chamber 60b, and the status of the inside of the second load lock chamber 60b. FIG. 5A illustrates the first and second conveying members 80a, 80b of the conveying apparatus 80, the first and second substrate processing chambers 40a, 40b, and the first and second load lock chambers 60a, 60b in a status prior to performing the below-described Step S1' of the substrate replacing method according to the related art example (a state immediately before the completion of Step S0'). FIG. 5B through FIG. 5E illustrate the statuses of the first and second conveying members 80a, 80b of the conveying apparatus 80, the first and second substrate processing chambers 40a, 40b, and the first and second load lock chambers 60a, 60b after Steps S1'-S4' of the substrate replacing method according to the related art example are completed.

The smallest unit of a substrate replacing operation performed by the substrate processing apparatus according to the related art example is indicated with reference numeral 410 and includes Steps S1' through S4' illustrated in FIG. 4A. As illustrated in the column of Step S1' of FIG. 4A and FIG. 5A, Step S1' is a step of conveying a wafer W1 out from the first substrate processing chamber 40a by using the first conveying member 80a. As illustrated in the column of Step S4' and FIG. 5A, Step S4' is a step of conveying a wafer W3 into the first substrate processing chamber 40a by using the second conveying member 80b. Further, as illustrated in the columns of Step S1' through S3' of FIG. 4A, a cleaning process is performed in the first substrate processing chamber 40a during Step S1' through S3'.

Figure 5C:
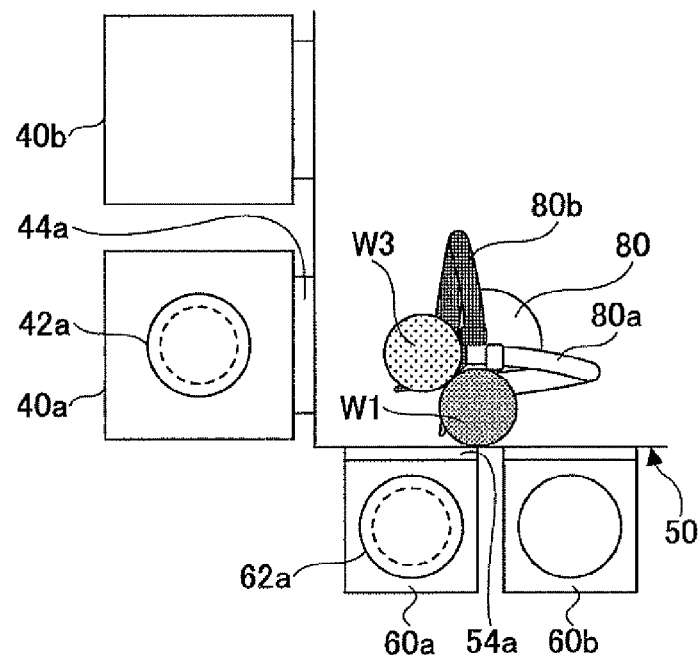
Figure 5D:
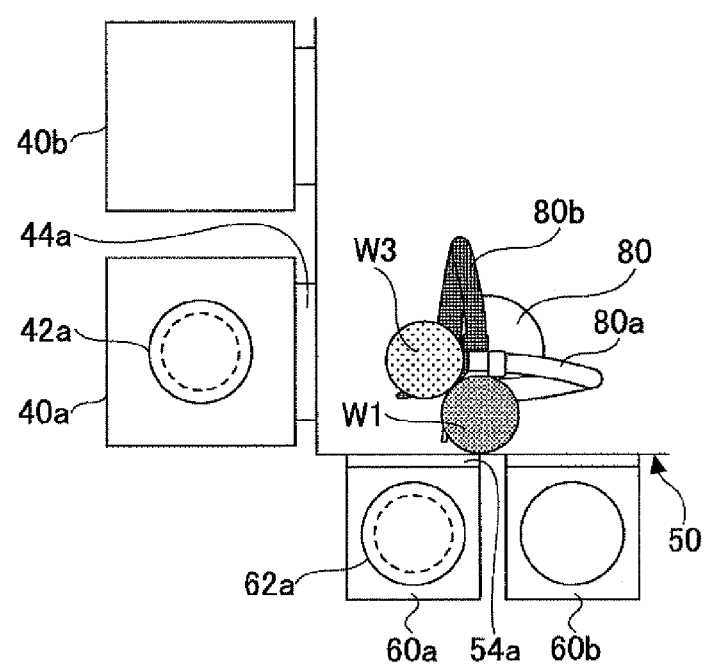
Figure 5E:
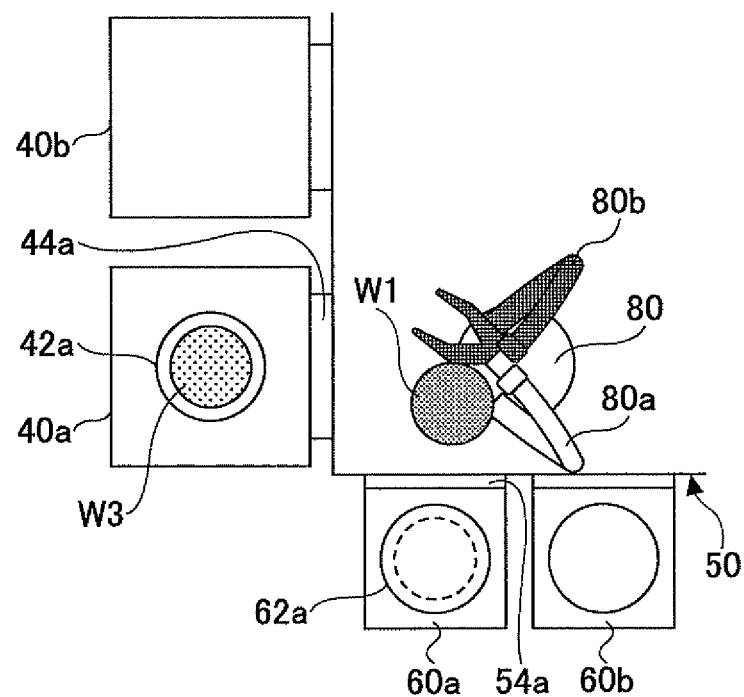

However, in Step S0' of the substrate replacing method according to the related art example, the wafer W3 is mounted on the second conveying member 80b beforehand as illustrated in the column of Step 0' and FIG. 5A. Further, the conveying apparatus 80 is unable to perform any processes between the step of conveying the processed wafer W1 from the first substrate processing chamber 40a by using the first conveying member 801 and the step of conveying an unprocessed wafer W3 into the first substrate processing chamber 40a by using the second conveying member 80b. During the period of performing the cleaning process in the first substrate cleaning chamber 40a between Step S2' and Step S3', the conveying apparatus 80, being in a state having the wafers W1 and W3 mounted on the first and second conveying members 80a, 80b (as illustrated in FIGS. 5C and 5D), waits until the cleaning process in the first substrate processing chamber 40a is finished.

As a result, because the conveying apparatus 80 of the substrate processing apparatus having first and second substrate processing chambers 40a, 40b and the first and second load lock chambers 60a, 60b cannot be operated in Steps S2' and S3' in a case where the substrate replacing method according to the related art example is used, a waiting time is created in the first and second substrate processing chambers 40a, 40b. For example, even if a substrate W3 is processed in the first substrate processing chamber 40a during Steps S5' through S7', the processed wafer W3 cannot be immediately conveyed out from the first substrate processing chamber 40a. This is because the conveying apparatus 80 having the wafer W2 and W4 mounted on the first and second conveying members 80a, 80b is in a state waiting for the cleaning process in the second substrate processing to be completed. As a result, the smallest unit of an operation including a substrate processing process according to the related art example is indicated with reference numeral 420 and includes Steps S1' through S12' (12 steps) illustrated in FIGS. 4A and 4S. Further, the smallest unit of an operation including a substrate processing process according to the related art example is indicated as rate limiting time T0 in the following description of the throughput of the substrate processing apparatus according to the related art example. The time for waiting for the completion of the cleaning process is included in the rate limiting time T0.

On the other hand, as described above with the substrate replacing method according to an embodiment of the present invention, the smallest unit of an operation including a substrate processing process includes Steps S1 through S8 (8 steps). In a case where the time for performing the cleaning process with the substrate replacing method according to an embodiment of the present invention is the same as that of the related art example, the time for performing a substrate processing process on a single wafer in a single substrate processing chamber with the substrate replacing method according to an embodiment of the present invention can be shorter than that of the related art example. Further, the smallest unit of an operation including a substrate processing process according to the embodiment of the present invention is indicated as rate limiting time T1 (described in detail below). The time for waiting for the completion of the cleaning process is not included in the rate limiting time T1.

Next, the advantage(s) of improving the throughput of the conveying apparatus 80 by using the substrate replacing method according to an embodiment of the present invention is described in comparison with the substrate replacing method of the related art example.

FIGS. 6A and 6B are graphs schematically illustrating the relationship between substrate processing time per single substrate and the throughput of a substrate processing apparatus according to an embodiment of the present invention and the related art example. FIG. 6A illustrates a graph corresponding to the substrate replacing method according to an embodiment of the present invention. FIG. 6B illustrates a graph corresponding to the substrate replacing method according to a related art example.

In a case of supposing that the throughput of the substrate processing apparatus is inversely proportional to the substrate processing time per substrate, the throughput of the substrate processing apparatus becomes greater as the substrate processing time per substrate becomes shorter. However, in a case where waiting time is included in a rate limiting time T0 according to the related art example, the throughput of the substrate processing apparatus of the related art example cannot be greater than the throughput P0 corresponding to the rate limiting time T0 even if the substrate processing time is shorter than the rate limiting time T0. As illustrated in FIG. 6B, the time including the time for waiting for the completion of the cleaning process according to the substrate replacing method of the related art example corresponds to rate limiting time T0.

On the other hand, the time that does not include any time for waiting for the completion of the cleaning process according to the substrate replacing method of the embodiment of the present invention corresponds to rate limiting time T1. The rate limiting time T1 which does not include any time for waiting for the completion of the cleaning process is shorter than the rate limiting time T0 including the time for waiting for the completion of the cleaning process. That is, T1<T0. Accordingly, the throughput P1 of the substrate processing apparatus corresponding to the rate limiting time T1 is greater than the throughput P0 of the substrate processing apparatus corresponding to the rate limiting time T0. That is, P1>P0. Therefore, with the substrate replacing method according to an embodiment of the present invention, the conveying apparatus 80 can exhibit its initial throughput to the fullest. Thereby, the throughput of the entire substrate processing apparatus can be improved.

Further, with the substrate replacing method according to an embodiment of the present invention, even if the cleaning time of the first substrate processing chamber 40 is increased, the rate limiting time T1 hardly increases and the throughput of the substrate processing apparatus 100 hardly decreases. Therefore, with the substrate replacing method according to an embodiment of the present invention, the cleaning process of the substrate processing chamber 40 can be performed for a sufficient amount of time while attaining substantially the same throughput as the substrate processing apparatus of the related art example.

It is to be noted that, the wafer W1 is conveyed into the first load lock chamber 60a (Step S3) after the step of conveying the wafer W3 out from the first load lock chamber 60a by using the second conveying member 80b (Step S2). However, in Step S3, the wafer W1 may be conveyed into a load lock chamber other than the first load lock chamber 60a (e.g., second load lock chamber 60b).

Further, the order of Step S2 and S3 may be switched. That is, the wafer W1 may be conveyed into the second load lock chamber 60b by the first conveying member 80a in Step S2. Then, in Step S3, the wafer W3 may be conveyed out from the first load lock chamber 60a by the second conveying member 80b. Further, when starting Step S1, the first conveying member 80a may be switched with the second conveying member 80b, and the first load lock chamber 60a may be switched with the second load lock chamber 60b.

Second Embodiment

Next, a substrate replacing method of a substrate processing apparatus according to a second embodiment of the present invention is described with reference to FIGS. 7A and 7B. In the description and the drawings of the second embodiment of the present invention, like components are denoted by like reference numerals as of those of the first embodiment of the present invention and are not described in further detail. The substrate replacing method of the second embodiment is different from the substrate replacing method of the first embodiment in that four steps are performed between the first convey-out step and the first convey-in step. According to the substrate replacing method of the first embodiment, two steps (second convey-out step and second convey-in step) are performed between the first convey-out step and the first convey-in step. According to the substrate replacing method of the second embodiment, in addition to performing the second convey-out step and the second convey-in step between the first convey-out step and the first convey-in step, a third convey-in step is performed between the first convey-out step and the second convey-out step and a third convey-out step is performed between the second convey-in step and the first convey-in step.

In other words, according to the substrate replacing method according to the second embodiment of the present invention, the third convey-in step, the second convey-out step, the second convey-in step, and the third convey-out step (four steps) are performed between the first convey-out step and the first convey-in step.

Further, a substrate processing apparatus capable of performing the substrate replacing method according to the second embodiment of the present invention includes plural substrate processing chambers; a load lock chamber; a conveying apparatus that conveys wafers in and out of the substrate processing chamber and the load lock chamber with two conveying members; and a control part that controls the conveying of the wafers by the conveying apparatus. That is, the substrate processing apparatus 100 illustrated in FIG. 1 includes at least two substrate processing chambers and one load lock chamber. However, the below-described embodiment of the substrate replacing method is described in a case where the substrate processing apparatus 100 includes three substrate processing chambers and two load lock chambers.

Figure 7B:
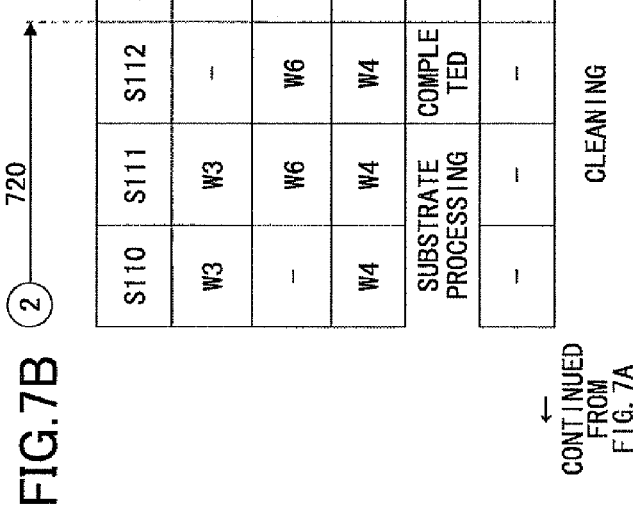

FIGS. 7A and 7B comprise a time chart for describing the substrate replacing method according to the second embodiment of the present invention in which the time chart indicates i) whether a wafer is mounted on the first or second conveying member, ii) whether a wafer is installed in the first, second, or third substrate processing chamber, iii) whether a wafer is installed in the first or second load lock chamber, iv) the status of the inside of the first, second, and third substrate processing chambers, and v) the status of the inside of the first and second load lock chambers. It is to be noted that FIG. 7A continues to FIG. 7B.

The top left column of the table of FIG. 7A show items which indicate: the step number, the wafer number corresponding to the wafer mounted on the first conveying member 80a of the conveying apparatus 80, the wafer number corresponding to the wafer mounted on the second conveying member 80b of the conveying apparatus 80, the wafer number corresponding to the wafer installed in the first substrate processing chamber 40a, the status of the inside of the first substrate processing chamber 40a, the wafer number corresponding to the wafer installed in the second substrate processing chamber 40b, the status of the inside of the second substrate processing chamber 40b, the wafer number corresponding to the wafer installed in the third substrate processing chamber 40c, the status of the inside of the third substrate processing chamber 40c, the wafer number corresponding to the wafer installed in the first load lock chamber 60a, the status of the inside of the first load lock chamber 60a, the wafer number corresponding to the wafer installed in the second load lock chamber 60b, and the status of the inside of the second load lock chamber 60b.

The smallest unit of a substrate replacing operation performed by the substrate processing apparatus according to the second embodiment of the present invention is indicated with reference numeral 710 and includes Steps S101 through S106 illustrated in FIG. 7A. As described below, Step S101 corresponds to a first convey-out step; Step S102 corresponds to a third convey-in step; Step S103 corresponds to a second convey-out step; Step S104 corresponds to a second convey-in step; Step S105 corresponds to a third convey-out step; and Step S106 corresponds to a first convey-in step.

Step S101 is a step of conveying a wafer W1 out from the first substrate processing chamber 40a by using the first conveying member 80a. Step S102 is a step of conveying a wafer W3 into the second substrate processing chamber 40b by using the second conveying member 80b. Step S103 is a step of conveying a wafer W4 out from the first load lock chamber 60a by using the second conveying member 80b. Step S104 is a step of conveying the wafer W1 into first load lock chamber 60a by using the first conveying member 80a. Step S105 is a step of conveying the wafer W2 out from the third substrate processing chamber 40c by using the first conveying member 80a. Step S106 is a step of conveying the wafer W4 into the first substrate processing chamber 40a by using the second conveying member 80b. According to the second embodiment of the present invention, the wafer W1 corresponds to a first substrate, the wafer W4 corresponds to a second substrate, the wafer W3 corresponds to a third substrate, and the wafer W2 corresponds to a fourth substrate.

The status prior to Step S101 is a state after the completion of Step S100 of FIG. 7A, that is, after substrate processing is performed on the wafer W1 in the first substrate processing chamber 40a. As illustrated in the column of Step S100 of FIG. 7A, no wafer is mounted on the first conveying member 80a; the wafer W3, being in an unprocessed state, is mounted on the second conveying member 80b; the wafer W1, being in a processed state, is installed in the first substrate conveying chamber 40a (i.e. mounted on the wafer pedestal 42a of the first substrate processing chamber 40a); no wafer is installed in the second substrate processing chamber 40b (i.e. mounted on the wafer pedestal 42b of the second substrate processing chamber 40b); the wafer W2, being in the middle of processing, is installed in the third substrate processing chamber 40c (mounted on the wafer pedestal 42c of the third substrate processing chamber 40c); and the wafer W4, being in an unprocessed state, is installed in the first load lock chamber 60a (i.e. mounted on the wafer pedestal 62a of the first load lock chamber 60a).

First, Step S101 is performed in the substrate replacing method according to the second embodiment of the present invention. In Step S101, the wafer W1 is conveyed out from the first substrate processing chamber 40a by the first conveying member 80a. In a state where a substrate processing process has been completed in the first substrate processing chamber 40a, the gate valve 44a of the first substrate processing chamber 40a is opened, then the first conveying member 80a is guided into the first substrate processing chamber 40a, then the wafer W1 on the wafer pedestal 42a of the first substrate processing chamber 40a is mounted on the first conveying member 80a, then the first conveying member 80a is withdrawn from the first substrate processing chamber 40a in a state having the wafer W1 mounted thereon, and then the gate valve 44a of the first substrate processing chamber 40a is closed.

As illustrated in the column of Step S101 of FIG. 7A, the wafer W1 is mounted on the first conveying member 80a; the wafer W3 is mounted on the second conveying member 80b; no wafers are installed in the first and second substrate processing chamber 40a, 40b; the wafer W2, being in the middle of processing, is installed in the third substrate processing chamber 40c; and the wafer W4, being in an unprocessed state, is installed in the first load lock chamber 60a.

After the gate valve 44a of the first substrate processing chamber 40a is closed, a cleaning process is performed inside the first substrate processing chamber 40a in a state where no wafer is mounted on the wafer pedestal 42a. Similar to the first embodiment, a plasma generating part (not illustrated) provided inside the first substrate processing chamber 40a may be used to perform the cleaning process. The plasma generating part performs the cleaning process by generating plasma inside the first substrate processing chamber 40a and removing particles adhered to the inner wall of the first substrate processing chamber 40 during a substrate processing process (e.g., deposition).

Then, Step S102 is performed. In Step S102, the wafer W3 is conveyed into the second substrate processing chamber 40b by the second conveying member 80b. In the second substrate processing chamber 40b in a state where the cleaning process is completed, the gate valve 44b of the second substrate processing chamber 40b is opened, then the second conveying member 80b is guided into the second substrate processing chamber 40b in a state having the wafer W3 mounted thereon, then the wafer W3 on second conveying member 80b is mounted on the wafer pedestal 42b of the second substrate processing chamber 40b, then the second conveying member 80b is withdrawn from the second substrate processing chamber 40b in a state having no wafer mounted thereon, and then the gate valve 44b of the second substrate processing chamber 40b is closed. After Step S102 is performed, the wafer W1 is mounted on the first conveying member 80a, no wafer is mounted on the second conveying members 80b, no wafer is installed in the first substrate processing chamber 40a, the wafer W3 is installed in the second substrate processing chamber 40b, the wafer W2 is installed in the third substrate processing chamber 40c, and the wafer W4 is installed in the first load lock chamber 60a.

The cleaning process in the first substrate processing chamber 40a is continued during Step S102.

Then, Step S103 is performed. In Step S103, the wafer W4 is conveyed out from the first load lock chamber 60a by the second conveying member 80b. In the first load lock chamber 60a being a vacuum state, the gate valve 54a located towards the conveying chamber 50 is opened, then the second conveying member 80b is guided into the first load lock chamber 60a, then the wafer W4 on the wafer pedestal 62a of the first load lock chamber 60a is mounted on the second conveying member 80b, then the second conveying member 80b is withdrawn from the first load lock chamber 60a in a state having the wafer W4 mounted thereon, and then the gate valve 54a located towards the conveying chamber 50 is closed. After Step S103 is performed, the wafer W1 is mounted on the first conveying member 80a, the wafer W4 is mounted on the second conveying member 80b, no wafer is installed in the first substrate processing chamber 40a, the wafer W3 is installed in the second substrate processing chamber 60a, the wafer W2 is installed in the third substrate processing chamber 40c, and no wafer is installed in the first load lock chamber 60a.

The cleaning process in the second substrate processing chamber 40a is continued during Step S103.

Then, Step S104 is performed. In Step S104, the wafer W1 is conveyed into the first load lock chamber 60a by the first conveying member 80a. In the first load lock chamber 60a being a vacuum state, the gate valve 54a located towards the conveying chamber 50 is opened, then the first conveying member 80a is guided into the first load lock chamber 60a in a state having the wafer W1 mounted thereon, then the wafer W1 on the first conveying member 80a is mounted on the wafer pedestal 62a of the first load lock chamber 60a, then the first conveying member 80a is withdrawn from the first load lock chamber 60a in a state having no wafer mounted thereon, and then the gate valve 54a located towards the conveying chamber 50 is closed. After Step S104 is performed, no wafer is mounted on the first conveying member 80a, the wafer W4 is mounted on the second conveying member 80b, no wafer is installed in the first substrate processing chamber 40a, the wafer W3 is installed in the second substrate processing chamber 40b, the wafer W2 is installed in the third substrate processing chamber 40c, and the wafer W1 is installed in the first load lock chamber 60a, as illustrated in the column of Step S104 of FIG. 7A.

The cleaning process in the second substrate processing chamber 40a is continued during Step S104.

In Step S105, the wafer W2 is conveyed out from the third substrate processing chamber 40c by the first conveying member 80a. In a state where a substrate processing process has been completed in the third substrate processing chamber 40c, the gate valve 44c of the third substrate processing chamber 40c is opened, then the first conveying member 80a is guided into the third substrate processing chamber 40a, then the wafer W2 on the wafer pedestal 42c of the third substrate processing chamber 40c is mounted on the first conveying member 80a, then the first conveying member 80a is withdrawn from the third substrate processing chamber 40c in a state having the wafer W2 mounted thereon, and then the gate valve 44c of the third substrate processing chamber 40c is closed. After Step S105 is performed, the wafer W2 is mounted on the first conveying member 80a, the wafer W4 is mounted on the second conveying member 80b, no wafer is installed in the first substrate processing chamber 40a, the wafer W3 is installed in the second substrate processing chamber 40b, no wafer is installed in the third substrate processing chamber 40c, and the wafer W1 is installed in the first load lock chamber 60a, as illustrated in the column of Step S105 of FIG. 7A.

Substantially at the same time as the completion of Step S105 or after the completion of Step S105, the cleaning process in the first substrate processing chamber 40a is completed before the start of Step S106.

Then, Step S106 is performed. In Step S106, the wafer W4 is conveyed into the first substrate processing chamber 40a by the second conveying member 80b. In the first substrate processing chamber 40a in a state where the cleaning process is completed, the gate valve 44a of the first substrate processing chamber 40a is opened, then the second conveying member 80b is guided into the first substrate processing chamber 40a in a state having the wafer W4 mounted thereon, then the wafer W4 on the second conveying member 80b is mounted on the wafer pedestal 42a of the first substrate processing chamber 40a, then the second conveying member 80b is withdrawn from the first substrate processing chamber 40a in a state having no wafer mounted thereon, and then the gate valve 44a of the first substrate processing chamber 40a is closed. After Step S106 is performed, the wafer W2 is mounted on the first conveying member 80a, no wafer is mounted on the second conveying member 80b, the wafer W4 is installed in the first substrate processing chamber 40a, the wafer W3 is installed in the second substrate processing chamber 40b, no wafer is installed in the third substrate processing chamber 40c, and the wafer W1 is installed in the first load lock chamber 60a.

Accordingly, by performing Steps S101 through S106, an operation of replacing the wafer W1 with the wafer W4 at the first substrate processing chamber 40a can be performed. As illustrated in FIG. 7A, a cleaning process in the first substrate processing chamber 40a can be performed when performing Step S101 through Step S105 (i.e. during 5 steps). Further, during the 5 steps, the conveying apparatus 80 can convey the wafer W3 into the second substrate processing chamber 40b, convey the wafer W4 out from the first load lock chamber 60a, convey the wafer W1 into the first load lock chamber 60a, and convey the wafer W2 out from the third substrate processing chamber 40c.

Then, by performing Steps S107 through S112, a wafer W5 can be conveyed out from the second load lock chamber 60b (Step S107) and conveyed into the third substrate processing chamber 40c (Step S110), the wafer W2 can be conveyed into the second load lock chamber 60b (Step S108), the wafer W3 can be conveyed out from the second substrate processing chamber 40b (Step S109) and conveyed into the first load lock chamber 60a (Step S112), and a wafer W6 can be conveyed out from the first load lock chamber 60a (Step S111). As illustrated in FIG. 7A, a cleaning process in the third substrate processing chamber 40c can be performed when performing Step S105 through S109 (i.e. during 5 steps).

Further, the wafer W4 can be processed in the first substrate processing chamber 40a when performing Steps S107 through S111.

It is to be noted that, in the above-described case of using the three substrate processing chambers (first-third substrate processing chambers 40a-40c) and two load lock chambers (first and second load lock chambers 60a, 60b), Steps S101 through S112 can be repeated on or after Step S113. That is, the smallest unit of an operation including a substrate processing process by using two substrate processing chambers is indicated with reference numeral 720 and includes Steps S101 through S112 (12 steps).

Like the substrate replacing method of the first embodiment, the substrate replacing method of the second embodiment can also prevent the conveying apparatus 80 from waiting for the cleaning process to be completed in a state having wafers mounted on the first and second mounting members 80a, 80b. Therefore, with the substrate replacing method of the second embodiment, the time required for processing a single wafer in a single substrate processing chamber can be shortened compared to that of the related art example.

As described above with reference to FIGS. 6A and 6B, the rate limiting time T1 which does not include the time of waiting for the completion of the cleaning process according to the second embodiment is shorter than the rate limiting time T0 which includes the time of waiting for the completion of the cleaning process according to the related art example. Therefore, the throughput P1 of the substrate processing apparatus according to the second embodiment is greater than the throughput P0 of the substrate processing apparatus according to the related art example. That is, with the second embodiment of the present invention, the conveying apparatus 80 can attain a sufficient throughput and the throughput of the entire substrate can be improved.

Third Embodiment

Next, a substrate replacing method of a substrate processing apparatus according to a third embodiment of the present invention is described with reference to FIGS. 8A and 8B. In the description and the drawings of the third embodiment of the present invention, like components are denoted by like reference numerals as of those of the first and second embodiments of the present invention and are not described in further detail. The substrate replacing method of the third embodiment is different from the substrate replacing method of the first embodiment in that six steps are performed between the first convey-out step and the first convey-in step. According to the substrate replacing method of the first embodiment, two steps (second convey-out step and second convey-in step) are performed between the first convey-out step and the first convey-in step. According to the substrate replacing method of the third embodiment, a fourth convey-in step is performed between the first convey-out step and the second convey-in step, a fourth convey-in step and a fifth convey-out step are performed between the second convey-in step and the second convey-out step, and a fifth convey-in step is performed between the second convey-out step and the first convey-in step.

In other words, according to the substrate replacing method according to the third embodiment of the present invention, the fourth convey-out step, the second convey-in step, the fourth convey-in step, the fifth convey-out step, the second convey-out step, and the fifth convey-in step (six steps) are performed between the first convey-out step and the first convey-in step.

Further, a substrate processing apparatus capable of performing the substrate replacing method according to the third embodiment of the present invention includes plural substrate processing chambers; plural load lock chambers; a conveying apparatus that conveys wafers in and out of the substrate processing chambers and the load lock chambers; and a control part that controls the conveying of the wafers by the conveying apparatus. That is, the substrate processing apparatus 100 illustrated in FIG. 1 includes at least two substrate processing chambers and two load lock chambers. However, the below-described embodiment of the substrate replacing method is described in a case where the substrate processing apparatus 100 includes three substrate processing chambers and two load lock chambers.

FIGS. 8A and 8B comprise a time chart for describing the substrate replacing method according to the third embodiment of the present invention in which the time chart indicates i) whether a wafer is mounted on the first or second conveying member, ii) whether a wafer is installed in the first, second, or third substrate processing chamber, iii) whether a wafer is installed in the first or second load lock chamber, iv) the status of the inside of the first, second, and third substrate processing chambers, and v) the status of the inside of the first and second load lock chambers. It is to be noted that FIG. 8A continues to FIG. 8B.

The top left column of the table of FIG. 8A shows items which indicate: the step number, the wafer number corresponding to the wafer mounted on the first conveying member 80a of the conveying apparatus 80, the wafer number corresponding to the wafer mounted on the second conveying member 80b of the conveying apparatus 80, the wafer number corresponding to the wafer installed in the first substrate processing chamber 40a, the status of the inside of the first substrate processing chamber 40a, the wafer number corresponding to the wafer installed in the second substrate processing chamber 40b, the status of the inside of the second substrate processing chamber 40b, the wafer number corresponding to the wafer installed in the third substrate processing chamber 40c, the status of the inside of the third substrate processing chamber 40c, the wafer number corresponding to the wafer installed in the first load lock chamber 60a, the status of the inside of the first load lock chamber 60a, the wafer number corresponding to the wafer installed in the second load lock chamber 60b, and the status of the inside of the second load lock chamber 60b.

The smallest unit of a substrate replacing operation performed by the substrate processing apparatus according to the third embodiment of the present invention is indicated with reference numeral 810 and includes Steps S201 through S208 illustrated in FIG. 8A. As described below, Step S201 corresponds to a first convey-out step; Step S202 corresponds to a fourth convey-out step; Step S203 corresponds to a second convey-in step; Step S204 corresponds to a fourth convey-in step; Step S205 corresponds to a fifth convey-out step; Step S206 corresponds to a second convey-out step; Step S207 corresponds to a fifth convey-in step; and Step S208 corresponds to a first convey-in step.

Step S201 is a step of conveying a wafer W1 out from the first substrate processing chamber 40a by using the first conveying member 80a. Step S202 is a step of conveying a wafer W3 out from the first load lock chamber 60a by using the second conveying member 80b. Step S203 is a step of conveying the wafer W1 into the first load lock chamber 60a by using the first conveying member 80b. Step S204 is a step of conveying the wafer W3 into the second substrate processing chamber 40b by using the second conveying member 80b. Step S205 is a step of conveying the wafer W2 out from the third substrate processing chamber 40c by using the first conveying member 80a. Step S206 is a step of conveying the wafer W4 out from the second load lock chamber 60b by using the second conveying member 80b. Step S207 is a step of conveying the wafer W2 into the second load lock chamber 60b by using the first conveying member 80a. Step S208 is a step of conveying the wafer W4 into the first substrate processing chamber 40a by using the second conveying member 80b. According to the third embodiment of the present invention, the wafer W1 corresponds to a first substrate, the wafer W4 corresponds to a second substrate, the wafer W3 corresponds to a third substrate, and the wafer W2 corresponds to a fourth substrate.

The status prior to Step S201 is a state after the completion of Step S200 of FIG. 8A, that is, after substrate processing is performed on the wafer W1 in the first substrate processing chamber 40a. As illustrated in the column of Step S200 of FIG. 8A, no wafers are mounted on the first and second conveying members 80a, 80b; the wafer W1, being in a processed state, is installed in the first substrate processing chamber 40a (i.e. mounted on the wafer pedestal 42a of the first substrate processing chamber 40a); no wafer is installed in the second substrate processing chamber 40b (i.e. mounted on the wafer pedestal 42b of the second substrate processing chamber 40b); the wafer W2, being in an unprocessed state, is installed in the third substrate processing chamber 40c (i.e. mounted on the wafer pedestal 42c of the third substrate processing chamber 40c); and the wafer W3, being in an unprocessed state, is installed in the first load lock chamber 60a (mounted on the wafer pedestal 62a of the first load lock chamber 60a). A wafer may or may not be installed in the second load lock chamber 60b.

First, Step S201 is performed in the substrate replacing method according to the third embodiment of the present invention. In Step S201, the wafer W1 is conveyed out from the first substrate processing chamber 40a by the first conveying member 80a. In a state where a substrate processing process has been completed in the first substrate processing chamber 40a, the gate valve 44a of the first substrate processing chamber 40a is opened, then the first conveying member 80a is guided into the first substrate processing chamber 40a, then the wafer W1 on the wafer pedestal 42a of the first substrate processing chamber 40a is mounted on the first conveying member 80a, then the first conveying member 80a is withdrawn from the first substrate processing chamber 40a in a state having the wafer W1 mounted thereon, and then the gate valve 44a of the first substrate processing chamber 40a is closed.

As illustrated in the column of Step S201 of FIG. 8A, the wafer W1 is mounted on the first conveying member 80a; no wafer is mounted on the second conveying member 80b; no wafers are installed in the first and second substrate processing chambers 40a, 40b; the wafer W2, being in the middle of processing, is installed in the third substrate processing chamber 40c; and the wafer W3, being in an unprocessed state, is installed in the first load lock chamber 60a. A wafer may or may not be installed in the second load lock chamber 60b.

After the gate valve 44a of the first substrate processing chamber 40a is closed, a cleaning process is performed inside the first substrate processing chamber 40a in a state where no wafer is mounted on the wafer pedestal 42a. Similar to the first embodiment, a plasma generating part (not illustrated) provided inside the first substrate processing chamber 40a may be used to perform the cleaning process. The plasma generating part performs the cleaning process by generating plasma inside the first substrate processing chamber 40a and removing particles adhered to the inner wall of the first substrate processing chamber 40 during a substrate processing process (e.g., deposition).

Then, Step S202 is performed. In Step S202, the wafer W3 is conveyed out from the first load lock chamber 60a by the second conveying member 80b. In the first load lock chamber 60a being a vacuum state, the gate valve 54a located towards the conveying chamber 50 is opened, then the second conveying member 80b is guided into the first load lock chamber 60a, then the wafer W3 on the wafer pedestal 62a of the first load lock chamber 60a is mounted on the second conveying member 80b, then the second conveying member 80b is withdrawn from the first load lock chamber 60a in a state having the wafer W3 mounted thereon, and then the gate valve 54a located towards the conveying chamber 50 is closed. After Step S202 is performed, the wafer W1 is mounted on the first conveying member 80a, the wafer W3 is mounted on the second conveying member 80b, no wafers are installed in the first and second substrate processing chambers 40a, 40b, the wafer W2 is installed in the third substrate processing chamber 40c, no wafer is installed in the first load lock chamber 60a, and the wafer W4 is installed in the second load lock chamber 60b.

The cleaning process in the first substrate processing chamber 40a is continued during Step S202.

Then, Step S203 is performed. In Step S203, the wafer W1 is conveyed into the first load lock chamber 60a by the first conveying member 80a. In the first load lock chamber 60a being a vacuum state, the gate valve 54a located towards the conveying chamber 50 is opened, then the first conveying member 80a is guided into the first load lock chamber 60a in a state having the wafer W1 mounted thereon, then the wafer W1 on the first conveying member 80a is mounted on the wafer pedestal 62a of the first load lock chamber 60a, then the first conveying member 80a is withdrawn from the first load lock chamber 60a in a state having no wafer mounted thereon, and then the gate valve 54a located towards the conveying chamber 50 is closed. After Step S203 is performed, no wafer is mounted on the first conveying member 80a, the wafer W3 is mounted on the second conveying member 80b, no wafers are installed in the first and second substrate processing chambers 40a, 40b, the wafer W2 is installed in the third substrate processing chamber 40c, the wafer W1 is installed in the first load lock chamber 60a, and the wafer W4 is installed in the second load lock chamber 60b, as illustrated in the column of Step S203 of FIG. 8A.

The cleaning process in the first substrate processing chamber 40a is continued during Step S203.

Then, Step S204 is performed. In Step S204, the wafer W3 is conveyed into the second substrate processing chamber 40b by the second conveying member 80b. In the second substrate processing chamber 40b in a state where the cleaning process is completed, the gate valve 44b of the second substrate processing chamber 40b is opened, then the second conveying member 80b is guided into the second substrate processing chamber 40b in a state having the wafer W3 mounted thereon, then the wafer W3 on second conveying member 80b is mounted on the wafer pedestal 42b of the second substrate processing chamber 40b, then the second conveying member 80b is withdrawn from the second substrate processing chamber 40b in a state having no wafer mounted thereon, and then the gate valve 44b of the second substrate processing chamber 40b is closed. After Step S204 is performed, no wafers are mounted on the first and second conveying members 80a, 80b, no wafer is installed in the first substrate processing chamber 40a, the wafer W3 is installed in the second substrate processing chamber 40b, the wafer W2 is installed in the third substrate processing chamber 40c, the wafer W1 is installed in the first load lock chamber 60a, and the wafer W4 is installed in the second load lock chamber 60b.

The cleaning process in the first substrate processing chamber 40a is continued during Step S204.

In Step S205, the wafer W2 is conveyed out from the third substrate processing chamber 40c by the first conveying member 80a. In a state where a substrate processing process has been completed in the third substrate processing chamber 40c, the gate valve 44c of the third substrate processing chamber 40c is opened, then the first conveying member 80a is guided into the third substrate processing chamber 40a, then the wafer W2 on the wafer pedestal 42c of the third substrate processing chamber 40c is mounted on the first conveying member 80a, then the first conveying member 80a is withdrawn from the third substrate processing chamber 40c in a state having the wafer W2 mounted thereon, and then the gate valve 44c of the third substrate processing chamber 40c is closed. After Step S205 is performed, the wafer W2 is mounted on the first conveying member 80a, no wafer is mounted on the second conveying member 80b, no wafer is installed in the first substrate processing chamber 40a, the wafer W3 is installed in the second substrate processing chamber 40b, no wafer is installed in the third substrate processing chamber 40c, the wafer W1 is installed in the first load lock chamber 60a, and the wafer W4 is installed in the second load lock chamber 60b, as illustrated in the column of Step S205 of FIG. 8A.

The cleaning process in the first substrate processing chamber 40a is continued during Step S205.

Then, Step S206 is performed. In Step S206, the wafer W4 is conveyed out from the second load lock chamber 60b by the second conveying member 80b. In the second load lock chamber 60b being a vacuum state, the gate valve 54b located towards the conveying chamber 50 is opened, then the second conveying member 80b is guided into the second load lock chamber 60b, then the wafer W4 on the wafer pedestal 62b of the second load lock chamber 60b is mounted on the second conveying member 80b, then the second conveying member 80b is withdrawn from the second load lock chamber 60b in a state having the wafer W4 mounted thereon, and then the gate valve 54b located towards the conveying chamber 50 is closed. After Step S206 is performed, the wafer W2 is mounted on the first conveying member 80a, the wafer W4 is mounted on the second conveying member 80b, no wafer is installed in the first substrate processing chamber 40a, the wafer W3 is installed in the second substrate processing chamber 60a, no wafer is installed in the third substrate processing chamber 40c, the wafer W5 is installed in the first load lock chamber 60a, and no wafer is installed in the second load lock chamber 60b.

The cleaning process in the first substrate processing chamber 40b is continued during Step S206.

Then, Step S207 is performed. In Step S207, the wafer W2 is conveyed into the second load lock chamber 60b by the first conveying member 80a. In the second load lock chamber 60b being a vacuum state, the gate valve 54b located towards the conveying chamber 50 is opened, then the first conveying member 80a is guided into the second load lock chamber 60b in a state having the wafer W2 mounted thereon, then the wafer W2 on the first conveying member 80a is mounted on the wafer pedestal 62b of the second load lock chamber 60b, then the first conveying member 80a is withdrawn from the second load lock chamber 60b in a state having no wafer mounted thereon, and then the gate valve 54b located towards the conveying chamber 50 is closed. After Step S207 is performed, no wafer is mounted on the first conveying member 80a, the wafer W4 is mounted on the second conveying member 80b, no wafer is installed in the first substrate processing chamber 40a, the wafer W3 is installed in the second substrate processing chamber 40b, no wafer is installed in the third substrate processing chamber 40c, the wafer W5 is installed in the first load lock chamber 60a, and the wafer W2 is installed in the second load lock chamber 60b, as illustrated in the column of Step S207 of FIG. 8A.

Substantially at the same time as the completion of Step S207 or after the completion of Step S207, the cleaning process in the first substrate processing chamber 40a is completed before the start of Step S208.

Then, Step S208 is performed. In Step S208, the wafer W4 is conveyed into the first substrate processing chamber 40a by the second conveying member 80b. In the first substrate processing chamber 40a in a state where the cleaning process is completed, the gate valve 44a of the first substrate processing chamber 40a is opened, then the second conveying member 80b is guided into the first substrate processing chamber 40a in a state having the wafer W4 mounted thereon, then the wafer W4 on the second conveying member 80b is mounted on the wafer pedestal 42a of the first substrate processing chamber 40a, then the second conveying member 80b is withdrawn from the first substrate processing chamber 40a in a state having no wafer mounted thereon, and then the gate valve 44a of the first substrate processing chamber 40a is closed. After Step S208 is performed, no wafers are mounted on the first and second conveying members 80a, 80b, the wafer W4 is installed in the first substrate processing chamber 40a, the wafer W3 is installed in the second substrate processing chamber 40b, no wafer is installed in the third substrate processing chamber 40c, the wafer W5 is installed in the first load lock chamber 60a, and the wafer W2 is installed in the second load lock chamber 60b.

Accordingly, by performing Steps S201 through S208, an operation of replacing the wafer W1 with the wafer W4 at the first substrate processing chamber 40a can be performed. As illustrated in FIG. 8A, a cleaning process in the first substrate processing chamber 40a can be performed when performing Step S201 through Step S207 (i.e. during 7 steps). Further, during the 7 steps, the conveying apparatus 80 can convey the wafer W3 out from the first load lock chamber 60a, convey the wafer W1 into the first load lock chamber 60a, convey the wafer W3 into the second substrate processing chamber 40b, convey the wafer W2 out from the third substrate processing chamber 40c, convey the wafer W4 out from the second load lock chamber 60b, and convey the wafer W2 into the second load lock chamber 60b.

Then, by performing Steps S209 through S211, processes such as conveying the wafer W3 out from the second substrate processing chamber 40b can be performed (Step S209). As illustrated in FIGS. 8A and 8B, a cleaning process in the third substrate processing chamber 40c can be performed when performing Step S205 through S211 (i.e. during 7 steps).

Further, the wafer W4 can be processed in the first substrate processing chamber 40a when performing Step S209 through S212.

It is to be noted that, in the above-described case of using the three substrate processing chambers (first-third substrate processing chambers 40a-40c) and two load lock chambers (first and second load lock chambers 60a, 60b), Steps S201 through S212 can be repeated on or after Step S213. That is, the smallest unit of an operation including a substrate processing process by using two substrate processing chambers is indicated with reference numeral 820 and includes Steps S201 through S212 (12 steps).

Like the substrate replacing method of the first embodiment, the substrate replacing method of the third embodiment can also prevent the conveying apparatus 80 from waiting for the cleaning process to be completed in a state having wafers mounted on the first and second mounting members 80a, 80b. Therefore, with the substrate replacing method of the third embodiment, the time required for processing a single wafer in a single substrate processing chamber can be shortened compared to that of the related art example.

As described above with reference to FIGS. 6A and 6B, the rate limiting time T1 which does not include the time of waiting for the completion of the cleaning process according to the third embodiment is shorter than the rate limiting time T0 which includes the time of waiting for the completion of the cleaning process according to the related art example. Therefore, the throughput P1 of the substrate processing apparatus according to the third embodiment is greater than the throughput P0 of the substrate processing apparatus according to the related art example. That is, with the third embodiment of the present invention, the conveying apparatus 80 can attain a sufficient throughput and the throughput of the entire substrate can be improved.

Further, with the third embodiment of the present invention, the cleaning process for each substrate processing chamber 40 can be performed for a longer time compared to the first and second embodiments of the present invention.

Further, the present invention is not limited to these embodiments, but variations and modifications may be made without departing from the scope of the present invention.

The present application is based on Japanese Priority Application No. 2009-089509 filed on Apr. 1, 2009, with the Japanese Patent Office, the entire contents of which are hereby incorporated by reference.

What is claimed is:

1. A method for replacing a plurality of substrates to be processed by a substrate processing apparatus including a substrate processing chamber, a load lock chamber, and a conveying apparatus including first and second conveying members for conveying the plural substrates into and out from the substrate processing chamber and the load lock chamber, the method comprising the steps of:
   a) conveying a first substrate out from the substrate processing chamber with the first conveying member;
   b) conveying a second substrate into the substrate processing chamber with the second conveying member;
   c) conveying the second substrate out from the load lock chamber with the second conveying member; and
   d) conveying the first substrate into the load lock chamber with the first conveying member;
   wherein the steps c) and d) are performed between step a) and step b).

2. The method as claimed in claim 1, wherein the step d) is performed after step c).

3. The method as claimed in claim 2, wherein the substrate processing apparatus further includes second and third substrate processing chambers, wherein the method further comprises the steps of:
   e) conveying a third substrate into the second substrate processing chamber with the second conveying member between step a) and step c); and
   f) conveying a fourth substrate out from the third substrate processing chamber with the first conveying member between step d) and step b).

4. The method as claimed in claim 1, wherein the load lock chamber includes a first load lock chamber part and a second load lock chamber part, wherein the first substrate is conveyed into the first load lock chamber part in step d), wherein the second substrate is conveyed out from the second load lock chamber part in step c).

5. The method as claimed in claim 4, wherein the substrate processing apparatus further includes second and third substrate processing chambers, wherein the method further comprises the steps of:
   e) conveying a third substrate out from the first load lock chamber part with the second conveying member;
   f) conveying the third substrate into the second substrate processing chamber with the second conveying member;
   g) conveying a fourth substrate out from the third substrate processing chamber with the first conveying member; and
   h) conveying the fourth substrate into the second load lock chamber part with the first conveying member;
   wherein step e) and step f) are performed between step a) and step b);
   wherein step h) is performed between step c) and step b).

6. The method as claimed in claim 1, further comprising:
   e) performing a process inside the substrate processing chamber during the step c).

7. The method as claimed in claim 6, wherein the process includes a cleaning process.

* * * * *